United States Patent [19]
Inushima et al.

[11] Patent Number: 5,610,405
[45] Date of Patent: Mar. 11, 1997

[54] ELECTRONIC DEVICE FOR MEASURING LIGHT PROPERTIES

[75] Inventors: Takashi Inushima; Rimantas Vaitkus; Satoshi Teramoto, all of Kanagawa, Japan

[73] Assignee: Semiconductor Energy Laboratory, Co., Ltd., Kanagawa-ken, Japan

[21] Appl. No.: 216,529

[22] Filed: Mar. 23, 1994

[30] Foreign Application Priority Data

| Mar. 24, 1993 | [JP] | Japan | 5-089115 |
| Mar. 30, 1993 | [JP] | Japan | 5-096666 |
| Apr. 2, 1993 | [JP] | Japan | 5-100412 |
| May 8, 1993 | [JP] | Japan | 5-131378 |
| Feb. 22, 1994 | [JP] | Japan | 6-047730 |

[51] Int. Cl.⁶ .................. G01J 1/24; G01J 1/42
[52] U.S. Cl. .............. 250/372; 250/370.07; 250/370.06; 250/370.14; 250/591
[58] Field of Search ........................ 250/372, 271, 250/484.5, 591, 370.06, 370.07, 370.14

[56] References Cited

U.S. PATENT DOCUMENTS 3,375,372  3/1968  Miyashita .................. 250/484.5
3,576,546  6/1968  Heyman et al. .
5,300,784  4/1994  Fender et al. .................. 250/591

FOREIGN PATENT DOCUMENTS 5281029  10/1993  Japan .................. 250/372

Primary Examiner—Carolyn E. Fields
Attorney, Agent, or Firm—Sixbey Friedman Leedom & Ferguson; Gerald J. Ferguson, Jr.; Evan R. Smith

[57] ABSTRACT

An electronic apparatus comprising a material having photoconductivity, an energy bandgap, and trap levels. The material is typified by a thin film of polycrystalline diamond. The material is illuminated with a first electromagnetic emission, (which may include visible light, ultraviolet light, gamma rays, or x-rays) having photon energies smaller than the energy bandgap of the material. Then, the material is illuminated with a second electromagnetic emission having photon energies greater than the energy bandgap of the material to thereby induce a photocurrent. The amount of the first emission can be known by measuring the induced photocurrent.

16 Claims, 15 Drawing Sheets

○ OPTICAL TRANSMISSION
▲ UV ILLUMINATED SAMPLE (15μW/cm$^2$)
● WITHOUT UV ILLUMINATION

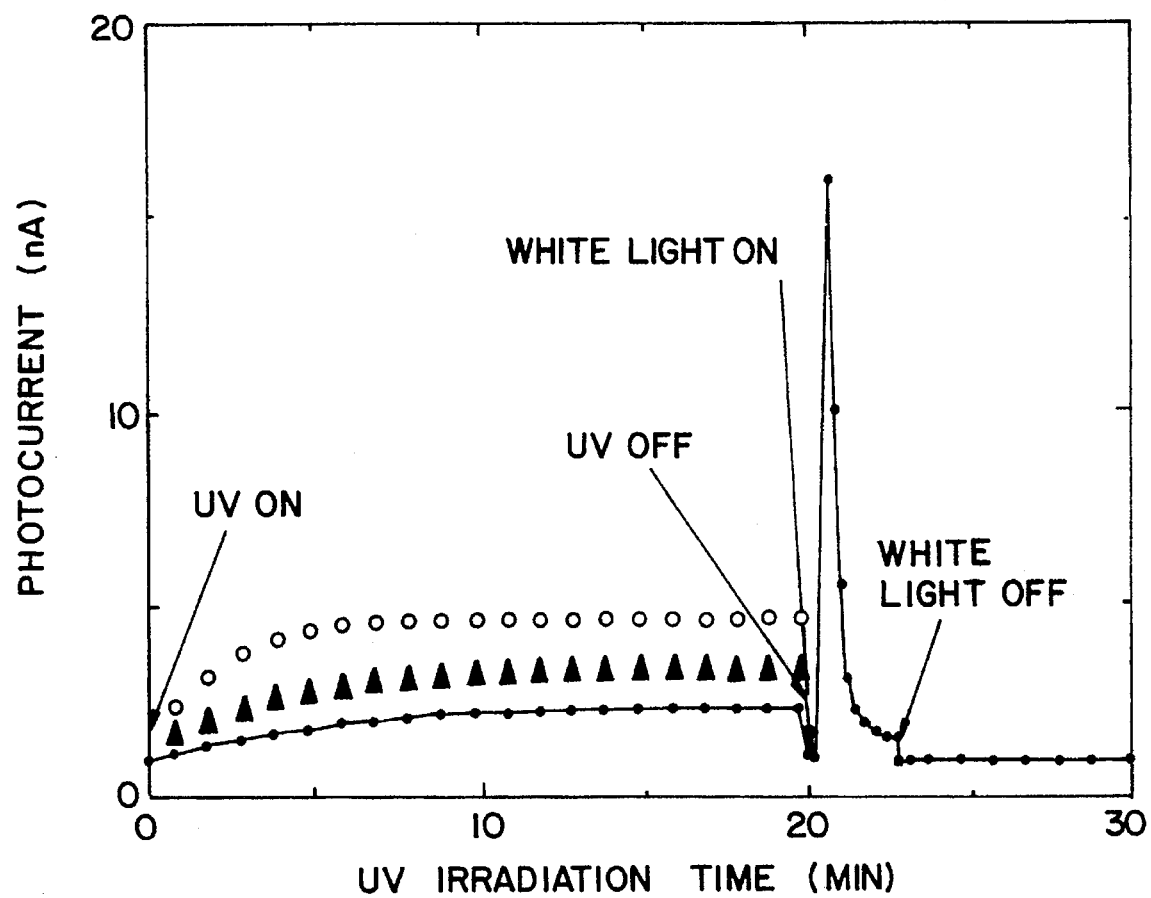

+

=

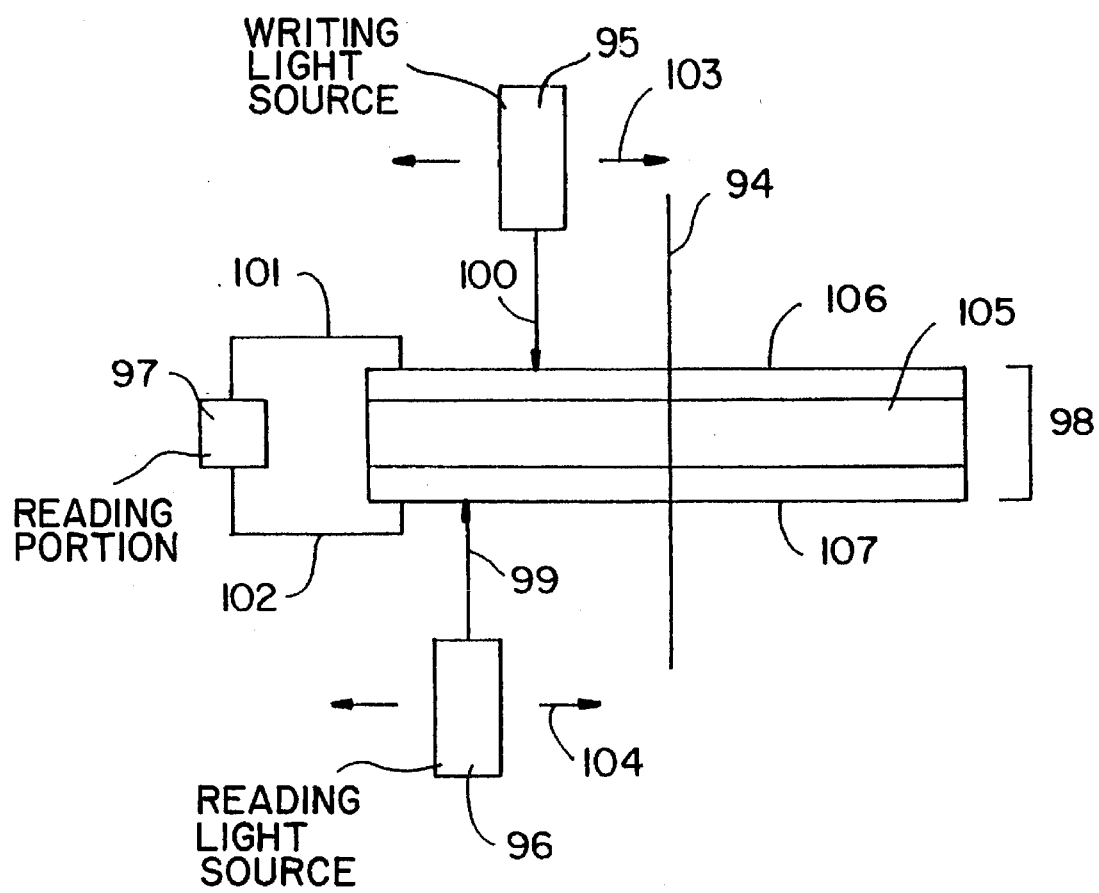

ELECTRONIC DEVICE FOR MEASURING LIGHT PROPERTIES

FIELD OF THE INVENTION

The present invention relates to an electronic device capable of performing at least one of the following functions: detection of light, detection of light amount, discrimination of different wavelengths of light, optical writing of information, reading of information written optically, receiving of light and delivering of an electrical current, and performing calculations.

BACKGROUND OF THE INVENTION

Some known apparatus for detecting light make use of the sensitivity of a semiconductor to light. Other known apparatus for detecting light use a photosensitive material. Still other known apparatus for detecting light utilize a photoelectric effect.

Some light-detecting apparatus which have been widely known employ a photovoltaic effect which converts a light energy into an electrical energy. Other light-detecting apparatus which have been widely known make use of photoconductivity, i.e., the conductivity of a semiconductor varies when illuminated with light. It is known that the former apparatus include photoelectric devices using a PN junction or PIN junction of silicon semiconductor. It is also known that the latter apparatus include photodiodes and phototransistors.

A known method for detecting ultraviolet radiation uses an alkalide phosphor that responds to ultraviolet radiation. Also, photomultipliers are known. Although these respond to UV light, they are unable to record information contained in UV light.

Also, a UV detector utilizing a diamond has been proposed, and its photosensitivity has been measured. However, this apparatus makes use of the photosensitivity of the diamond to UV light, i.c., variations in the electrical conductivity of the diamond induced by UV illumination. Again, this apparatus is unable to store information contained in UV light impinging on this apparatus.

Techniques for measuring the dose of illuminating light or radiation by exploiting light emission from the illuminated material are known and called optically stimulated luminescence (OSL) (Solid State Physics, 2, No. 324, Vol. 28, 1993, pp. 49–58).

This OSL is caused in the manner described below. BaFBr doped with Eu or RbBr doped with Tl is illuminated with UV light or visible light. The BaFBr or RbBr is further illuminated with infrared radiation that acts as stimulating light. The amount or intensity of light emitted corresponds to the amount of the UV or visible light emitted first.

The above-described optically stimulated luminescence can be roughly understood from a model described below. BaFBr or the like is doped with Eu that is a phosphor. UV light having energies greater than the bandgap energy of the phosphor is made to hit the BaFBr, so that electron-hole pairs are generated inside the phosphor. Some of the electron-hole pairs are trapped in lattice defects and in the centers of capture of positive holes or electrons which are created by impurities. Since these centers of capture are located deep in the bandgap, electrons and positive holes captured in the centers are in stable state even at room temperature. The levels of the energies at which the centers of capture exist correspond to the energies of the light in the infrared region. Accordingly, light at these levels is directed as stimulating light to the phosphor. In this way, electrons and positive holes captured in the centers of capture recombine, thus emitting light.

The intensity of the emitted light is in proportion to the amount of the illuminating UV light. Therefore, in principle, it should be possible to read and write the amount of the UV light by making use of this phenomenon. However, when one attempts to measure the amount of the illuminating UV light by making use of this phenomenon, the intensity of light emitted from the phosphor is so weak that the method is not practical. The intensity of the emitted light may be effectively increased by increasing the thickness of the phosphor film. If the phosphor film thickness is increased, the intensity of the illuminating UV light and the intensity of the stimulating light for reading the amount of illuminating UV light must be increased. If the intensity of the reading light is increased, local heating occurs. The produced heat diffuses to the surroundings. This deteriorates the resolution at which information is read out. If the thickness of the film of the phosphor is increased, scattering of the light is increased. This also leads to a decrease in the resolution at which information is read and written.

In this way, the detection of UV light utilizing optically stimulated luminescence (i.e., the stimulating light is emitted, light is generated, and yet the generated light must be observed) suffers from fundamental difficulties. In consequence, this method has low practicability.

The background of the present invention is further described below. Referring to FIGS. 2, (a) and (b), there is shown a UV detector. FIG. 2(a) is a top view of the UV detector. FIG. 2(b) is a cross-sectional view taken on line A–A' of FIG. 2(a). This detector comprises a thin diamond film 21, a pair of electrodes 22, 23, and a pair of output electrodes 24, 25.

FIG. 1 shows the relation of logarithmic values of the photosensitivity of the diamond film 21 of the UV detector shown in FIGS. 2, (a) and (b), to the photon energy of light impinging on the diamond film 21. Also, the relation of the photon energy of the light impinging on the diamond film to the transmission, or transmittance, of the diamond film is shown. In the graph, the photon energy hv is plotted on the horizontal axis. In practice, however, the wavelength of the light corresponds to the transmission. That is, the wavelength of the light is converted into an energy expressed in electron volts (eV) and plotted on the horizontal axis.

In FIG. 1, white circles indicate the dependence of the transmission of the diamond film on wavelength, which should be read on the right scale. Black triangles are obtained by illuminating the diamond film with light of wavelengths of 180 to 380 nm corresponding to energies of about 6.9 to 3.3 eV, and then measuring the photosensitivity of the diamond film 21. The light of wavelengths of 180 to 380 nm whose corresponding energies are plotted on the horizontal axis is produced by a deuterium discharge lamp, the intensity of the light being 15 µW/cm$^2$. Black circles indicate the photosensitivity when only light having wavelengths plotted on the horizontal axis is emitted without illuminating the deuterium discharge lamp.

In the present patent specification, x E($\lambda$)=1240 is used as an approximation formula for converting wavelength (nm) into photon energy E($\lambda$) (in eV).

We now take notice of the white circles. It can be seen that the transmission drops rapidly from around 5.5 eV. This indicates that the energy bandgap of the thin diamond film is approximately 5.5 eV corresponding to a wavelength of about 230 nm. With respect to black circles, the photosensitivity increases with increasing the photon energy of the illuminating light, i.e., as the wavelength of the illuminating light shortens.

With respect to the black triangles, the photosensitivity is almost constant at wavelengths having energies exceeding about 2.8 eV corresponding to a wavelength of about 440 nm. Above about 5 eV corresponding to a wavelength of about 250 nm, the black triangles assume values close to the values indicated by the black circles which are obtained when the deuterium discharge lamp is not lit up. Comparing the results (indicated by the black triangles) of measurements of the photosensitivity made while the deuterium discharge lamp is producing UV light with the results (indicated by the black circles) of measurements of the photosensitivity made without the UV irradiation shows that their trajectories are almost the same above about 5 eV and differ widely below about 5 eV. The energy of about 5 eV is quite close to the energy bandgap of diamond, or about 5.5 eV. We observe that both values are almost coincident.

It can be seen from FIG. 1 that the photosensitivity to light of energies less than about 5 eV corresponding to wavelengths of about 250 nm and above is affected by the illumination of the UV light from the deuterium discharge lamp. Thus, we can understand that the photosensitivity obtained when light of energies less than about 5 eV contains information about illumination of wavelengths exceeding 5 eV of the UV light emitted from the deuterium discharge lamp.

We can conclude from the foregoing that when the diamond is illuminated with UV light having wavelengths shorter than the wavelength approximately corresponding to the energy bandgap of the diamond, the information can be taken from the photocurrent by illuminating the diamond with light having wavelengths longer than the wavelength substantially corresponding to the energy bandgap of the diamond.

FIG. 3 shows the relation of the photocurrent to the UV irradiation time when the device shown in FIGS. 2, (a) and (b), is illuminated with light having wavelengths of 180 to 350 nm, the light being emitted from the deuterium discharge lamp. That is, FIG. 3 indicates the dependence of the photocurrent induced in the UV detector shown in FIGS. 2, (a) and (b), on time for the UV light having wavelengths of 180 to 350 nm. At this time, the photocurrent induced in the diamond film 21 is measured by applying a certain bias voltage of about 10 V between the electrodes 22 and 23 which are spaced 0.7 mm from each other while illuminating the thin diamond film 21 with the light from the deuterium discharge lamp. The photocurrent which is of the order of picoamperes is amplified by an operational amplifier and converted into a voltage by a resistor of 1 GΩ. This voltage is produced from a plotter. Actual values are obtained from this plotter output.

Three curves are shown in FIG. 3. The curve indicated by the white circles was obtained when UV light of intensity 34 $\mu W/cm^2$ was emitted. The curve indicated by the black triangles was obtained when UV light of intensity 15 $\mu W/cm^2$ was emitted. The curve indicated by the black dots (interposed by curves) was obtained when UV light of intensity 7 $\mu W/cm^2$ was emitted.

The right end of the curve indicated by the black dots indicates that the pulsed photocurrent flowed. This curve was derived by illuminating the thin diamond film 21 with white light having wavelengths of 360 to 800 nm after the end of illumination of UV light from the deuterium discharge lamp and measuring the induced photocurrent.

It can be seen from FIG. 3 that the saturated value of the photocurrent varies, depending on the intensity of the illuminating light from the deuterium discharge lamp. Data about this relation is shown in FIG. 4, where logarithmic values of the intensity of illuminating light from the deuterium discharge lamp is plotted on the horizontal axis, while the logarithmic ratio of the photocurrent induced when the UV light is not emitted to the photocurrent saturated by illumination of the UV light is plotted on the vertical axis. That is, FIG. 4 shows the relation between the UV radiant intensity when the UV detector shown in FIGS. 2, (a) and (b), is illuminated with UV light and the ratio of the photocurrent in illuminated state to the photocurrent in dark state. It can be seen from FIG. 4 that a clear proportional relationship exists between the intensity of UV light and the saturated photocurrent over a range of about three orders of magnitude.

In FIG. 5, the intensity of the UV light emitted from the deuterium discharge lamp is plotted on the horizontal axis, while the time taken for the photocurrent to reach 90% of the saturated level is plotted on the vertical axis. It can be seen from FIG. 5 that when the intensity of the UV light is weak, it takes a long time for the photocurrent to become saturated. However, when the intensity of the UV light is strong, it takes a short time for the photocurrent to become saturated.

The right side of the graph of FIG. 3 shows variations in the photocurrent occurring when the thin diamond film 21 is illuminated with white light after the film 21 is sufficiently illuminated with the UV light from the deuterium discharge lamp at a radiant intensity of 7 $\mu m/cm^2$. Line (a) of FIG. 6 shows the relation between the peak value (in arbitrary units) of the photocurrent induced by illumination of white light after emission of UV light and the amount of UV light (in $\mu Ws/cm^2$) emitted from the deuterium discharge lamp. Line (a) is plotted on the left scale. Line (b) of FIG. 6 shows the relation between the total area (in arbitrary units) under the photocurrent curve when white light is emitted for 5 minutes and the amount of UV light from the deuterium discharge lamp. Line (b) is plotted on the right side.

The amount of light is defined as the radiant intensity x the irradiation time and also known as dose. The amount of light is expressed in $\mu Ws/cm^2$. The total amount under the photocurrent curve is obtained by integrating the photocurrent induced by white light illumination shown in FIG. 3 for 5 minutes with respect to time. In FIG. 6, relative values of the total amount are shown.

It can be seen from line (a) of FIG. 6 that a proportional relation exists between the UV dose of the thin diamond film 21 and the peak value of the photocurrent induced when the film 21 is illuminated with white light after UV illumination. It can be seen from line (a) of FIG. 6 that points (indicated by the black circles, the black triangles, and the white circles) corresponding to values of the radiant intensity of UV light are roughly located on a straight line. In consequence, the peak value of the photocurrent induced by the illumination of the white light precisely reflects the dose rather than the radiant intensity of the UV light.

It can be seen from line (b) that a proportional relation exists between the amount of UV light, or dose, impinging on the thin diamond film and the total amount of the photocurrent induced when the diamond is illuminated with white light for 5 minutes after UV illumination. It can be understood that the UV dose can be found from the total amount of the photocurrent induced by the illumination of the white light.

We can conclude from the experimental data shown in FIG. 6 that the amount of the UV light which is emitted from the deuterium discharge lamp and falls on the thin diamond film 21 is determined either from the peak value of the photocurrent induced in the diamond film 21 by illumination of the white light or from the total amount of the photocurrent obtained by integrating the photocurrent for a given time. That is, the white light can be used as reading light for reading the amount of UV light impinging on the diamond film.

The peak value of the photocurrent induced by illumination of white light can be considered to be the total amount of the photocurrent within an infinitesimal time which is obtained by integrating the photocurrent for an infinitesimal time. If the infinitesimal time is defined as a given time, measurement of the peak value of the photocurrent is essentially the same as measurement of the total amount of the photocurrent within a given time.

As indicated on the right side of FIG. 3, when white light is emitted after UV irradiation and the peak value of the induced photocurrent is measured, the peak value decreases slowly as the white light is emitted. Thus, we observe that information about the emitted UV light is read out and erased as the diamond is irradiated with white light.

In the example shown in FIG. 3, white light having wavelengths ranging from 360 to 800 nm is used as reading light. Data obtained when light having a single wavelength is used as the above-described reading light is shown in FIG. 7. In FIG. 7, energies (in eV) converted from wavelengths are plotted on the horizontal axis, whereas the time taken for the photocurrent induced when the reading light is emitted to decrease to 10% of its peak value is plotted on the vertical axis. To obtain the single wavelength, a spectroscope is used.

It can be seen from FIG. 7 that as the energy of the wavelength of the reading light for reading the amount of the UV light decreases, i.e., as the wavelength is increased, the photocurrent decreases more slowly. As the energy of the wavelength of the reading light is increased, the photocurrent decreases more rapidly. We can understand that as the energy of the reading light for reading the amount of UV light decreases, i.e., as longer wavelength is used, the reading time is prolonged. Conversely, if the wavelength has a larger energy, the reading time is made shorter.

When the reading light is omitted continuously, the photocurrent decreases gradually as shown on the right side of FIG. 3 though the rate of decrease is affected by the wavelength. After the reading light is emitted sufficiently, i.e., after the photocurrent has decreased sufficiently, if illumination of the reading light is once made to cease and then the illumination is restarted, then a photocurrent as shown in FIG. 3 no longer flows. This means that illumination of a sufficient amount of reading light destroys information regarding the amount of illuminating UV light. In the example shown in FIG. 3, white light is used as the reading light. In this case, the information is read out in a short time, as shown in FIG. 3. However, utilizing this phenomenon, information written by UV light can be erased.

Where pulsed light of a short duration is used as reading light, the peak value of the photocurrent induced by the illumination of the reading light has a proportional relation with the UV dose, as shown also in FIG. 6. In this case, whenever each pulse is irradiated as reading light, the peak value of the photocurrent correctly reflecting the UV dose can be obtained. Hence, the UV dose can be read out plural times. Of course, if the reading is repeated, the peak value of the photocurrent induced by irradiation of the reading light gradually decreases although at varying rates.

The number of these reading operations can be roughly known from the data shown in FIG. 7. As an example, light having a wavelength of about 520 nm corresponding to energy 2.4 eV is used as reading light. It is assumed that the irradiation time required for one reading operation is on the order of milliseconds. The amount of the UV light impinging on the diamond film can be known by performing more than $10^3$ reading operations. If it is only necessary to know whether UV light is irradiated, more than $10^4$ reading operations can be carried out. Of course, if the wavelength of the pulsed light for reading is shortened, then the number of reading operations for precisely reading the amount of the UV light decreases with the tendency shown in FIG. 7, where the number of reading operations is plotted on the vertical axis, and the values of energies corresponding to wavelengths of pulsed light are plotted on the horizontal axis.

Where pulsed light is used as reading light, if the radiant intensity is large, the number of accurate measurements of the UV dose is small. Conversely, if the radiant intensity is small, the number of measurements is large.

The fundamental data shown in FIGS. 1 and 3 to 7 have been obtained where a deuterium discharge lamp having a wavelength range from 180 nm to 350 nm is used as a UV light source. Therefore, we consider that when information regarding the amount of the UV light is written into the thin diamond film, the fundamental data is simultaneously read out with the reading light having wavelengths longer than about 230 nm corresponding to the energy bandgap of the diamond. Since the radiant intensity spectrum of the deuterium discharge lamp used in this experiment has takes such a form that it is stronger at shorter wavelengths and weaker at longer wavelengths. Therefore, we think that the effects of light having wavelengths longer than about 230 nm corresponding to the energy bandgap of the diamond are small.

To confirm this consideration, the deuterium discharge lamp was illuminated. At the same time, a mercury lamp having large energies at wavelengths longer than 230 nm was illuminated. Then, white light was emitted. The resulting photocurrent was measured. We have confirmed that this photocurrent is weak. In this case, therefore, we understand that the light having wavelengths longer than about 230 nm greatly affects the emission of light having wavelengths shorter than about 230 nm. On the other hand, the effects of light from the deuterium discharge lamp, i.e., having wavelengths longer than about 230 nm, are small. A different experiment was conducted. In particular, only the mercury lamp was lit up without illuminating the deuterium discharge lamp. Then, white light was emitted, and the resulting photocurrent was measured. This measured photocurrent was similar to the photocurrent shown in FIG. 3 but had smaller values. This did not enable measurement of the amount of light from the mercury lamp. It is considered that almost all wavelengths contained in the light emitted from the mercury lamp have energies smaller than about 5.5 eV that is the energy bandgap of diamond. This phenomenon also occurs where white light is emitted simultaneously with illumination of the mercury lamp.

It has been confirmed that in an ordinary room or in a room illuminated with light (which can be regarded as white light) of intensity comparable to outside brightness, data shown in FIGS. 3 and 6 are obtained with high reproducibility. That is, even where reading light is emitted, if the center of the spectrum of the reading light has a wavelength corresponding to the energy much lower than the bandgap of the material, then illumination of writing light does not impede integration of the amount of illuminating light.

Therefore, where diamond is used, detection of UV light in an ordinary room or outside can be selectively done without the need of a filter or the like.

What are obtained from the above considerations are summarized below.

(1) Information regarding UV light having photon energies exceeding the energy bandgap of diamond can be measured by measuring the peak value of the photocurrent induced by reading light having photon energies less than the energy bandgap of the diamond. That is, information about the UV light having wavelengths shorter than about 230 nm impinging on the diamond can be read by illuminating the diamond with the reading light having wavelengths longer than about 230 nm.

(2) A plurality of reading operations can be performed by using pulsed light as the reading light.

(3) The number of reading operations can be increased by using a longer wavelength of light as the reading light.

(4) The number of the reading operations can be increased by using reading light of lower intensity.

(5) Information regarding the amount of the illuminating UV light can be erased by using white light as reading light, increasing the amount of the reading light, or reading out the stored information slowly.

In the item (1) above, the information about UV light means information about at least one of the amount of the UV light impinging on the diamond material, the presence or absence of irradiation, and difference in wavelength.

In order to understand the mechanism by which information about the amount of the illuminating UV light is stored in the diamond, a model of operation is now considered. Referring again to FIG. 1, the diamond is illuminated with light having energies less than about 5 eV to induce a photocurrent. We can understand that UV light impinging on the diamond and having energies exceeding about 5 eV produced effects. Also, we can see that points indicated by the black circles and points indicated by the triangles have different photosensitivities at less than about 5 eV and that the difference appears over the whole energy less than about 5.5 eV. Thus, we can consider that information concerning the illuminating UV light is distributed over the whole bandgap of about 5.5 eV of the diamond. Accordingly, we consider the following model and experimental data shown in FIGS. 1 and 3 to 7.

(a) Numerous impurities and lattice defects exist in a diamond crystal, and these form trap levels over the whole energy bandgap.

(b) Accordingly, UV light for exciting electrons in the diamond crystal is made to hit the crystal to optically induce electrons and positive holes. The electrons and the positive holes are captured in the trap levels in such a manner that they correspond to information about the amount of the illuminating UV light.

(c) If light having an energy necessary to excite them out of the trap levels, i.e., light having an energy less than the energy bandgap of the diamond, is emitted as reading light, carriers captured in the trap levels are excited. If a bias voltage is applied, the excited carriers produce a photocurrent. The amount of the UV light can be determined from this photocurrent. It can be seen from the data shown in FIG. 6 that the total amount of the photocurrent in a given time reflects the number of carriers excited out of the trap levels by UV illumination. That information about the amount of UV light is read out and erased with white light as shown in FIG. 3 means that the carriers captured in the trap levels have been all excited into carriers contributing to the photocurrent by UV illumination.

In the above-described experiment using a mercury lamp, the amount of light from the mercury lamp cannot be read from the photocurrent induced by illumination of white light. The reason why the amount of light cannot be read from the photocurrent may be understood as follows.

The spectrum of the radiant intensity of a mercury lamp is largely in a wavelength range exceeding about 230 nm, and the intensity of the spectrum is strong between about 250 and 400 nm. The spectrum contains very weak wavelengths corresponding to energies higher than the bandgap of diamond. Carriers are trapped in trap levels by these weak wavelengths and simultaneously excited by the wavelengths longer than about 230 nm. In other words, the apparent number of carriers trapped in the trap levels is reduced greatly.

In any case, the photocurrent which is attributed to the carriers trapped in the trap levels and induced by white light is quite weak. As a result, the value of the photocurrent fails to correctly reflect the amount of light emitted from the mercury lamp.

Where the diamond is illuminated with white light and also with the light from the mercury lamp and then the resulting photocurrent is measured, the amount of light from the lamp can also not be determined from the photocurrent. One would be able to understand that the reason why the photocurrent cannot be determined from the amount of light is that the number of carriers trapped in the trap levels is quite few.

The results of our consideration of the experimental data shown in FIGS. 3 to 7, using the model described above, are described below.

(a) As UV light hits the diamond, the trap levels are gradually buried by electrons and finally saturated.

(b) We consider that the value of the photocurrent induced by illumination of reading light is associated with at least one of the number of trap levels in which carriers are captured and the depths of the trap levels.

(c) We think that the rate at which the trap levels are buried depends on the total energy of UV light.

(d) We consider that the number of carriers trapped in the trap levels is determined by the total energy of the UV light impinging on the diamond.

(e) We consider that the photocurrent induced by illumination of white light depends on at least one of the number of trap levels in which carriers are captured and the depths of the trap levels. That is, the photocurrent induced by the white light illumination indicates the total energy of the UV energy impinging on the diamond.

(f) UV light is considered to have two kinds of energies: its radiant intensity and energies possessed by its wavelengths. If this is taken into consideration, the number of electrons trapped in the trap levels should differ, of course, according to the energy of each wavelength where the amount of UV light is set to a given value and the wavelength of the UV light is varied.

(g) In this case, therefore, the value of the photocurrent induced by the illumination of reading light should vary, depending on the wavelength of the UV light.

We conclude from the above considerations that variations in wavelength of UV light first directed to a diamond can be detected by setting the amount of the UV light to a given value, irradiating the diamond with UV light rays having different wavelength regions separately, and measuring the photocurrent induced by illumination of reading light. We understand that in the experiments giving rise to the data shown in FIGS. 1 and 3 to 7, UV light having the same radiant intensity spectrum, or the same wavelength region, emitted from a deuterium discharge lamp is used, and the total UV dosage of the diamond is varied by varying the amount of the UV light.

We have obtained experimental data which supports the results of the above considerations. In particular, light emanating from a deuterium discharge lamp was divided into certain wavelength regions by a spectrograph. Using the spectrally divided UV light rays, the relation between the wavelength of the UV light and the value of the photocurrent induced by the irradiation of reading light, or white light, was examined. We have confirmed that UV light having a wavelength of 180 nm and UV light having a wavelength of 200 nm produced different values of photocurrent in response to the irradiation of the reading light. Of course, the two kinds of UV light were made coincident in light amount. However, when the light from the deuterium discharge lamp was spectrally split, the radiant intensity was reduced greatly, i.e., by a factor of more than 10. Hence, a sufficiently large photocurrent could not be produced in response to the reading light. As a result, we could not obtain a clear relation between the wavelength of UV light and the photocurrent induced by illumination of the reading light.

We further discuss the model described above. We conclude that materials to which the model can be applied must satisfy the following requirements:

(a) They show photoconductivity. That is, they have sensitivity to light.

(b) They have some form of trap levels which trap excited electrons.

(c) They have energy bandgaps.

All of materials which are called semiconductors intrinsically possess the above-described physical properties.

Accordingly, we have been led to the recognition that materials which are different from diamond but have the physical properties (a)–(c) described above respond to light as shown in FIGS. 1 and 3 to 7 in principle, and that their nature can be exploited. In other words, the present invention has been made, based on the recognition that materials which are different from diamond but have the physical properties (a)–(c) described above produce experimental data shown in FIGS. 1 and 3 to 7 in principle, and that their nature can be exploited.

Where materials having the physical properties (a)–(c) are used, the contents of the items (1)–(5) described above are modified, based on the recognition described above, as follows.

(1') Information about light impinging on a material and having photon energies larger than the energy bandgap of the material can be known from the photocurrent produced in response to reading light having photon energies smaller than the energy bandgap of the material.

(2') A plurality of reading operations can be performed by using pulsed light as the reading light.

(3') The number of reading operations can be increased by using a longer wavelength of light as the reading light.

(4') The number of the reading operations can be increased by using reading light of lower intensity.

(5') Information stored in the material can be erased by reading out the information. For this purpose, the material is illuminated with reading light having an energy lower than the energy bandgap of the material in such a way that (i) the light has a considerable range of wavelengths, i.e., the total energy is large, (ii) the light amount is considerably large, i.e., the total energy is large, or (iii) the illumination time is long, i.e., the total energy is large.

The aforementioned information about light described in the item (1') above is information concerning at least one of the amount of the light impinging on the material, the presence or absence of irradiation, difference in wavelength, and difference in radiant intensity spectrum of the light having a wavelength corresponding to a photon energy greater than the energy bandgap of the material. Of course, if the total energy differs, the number of trapped carriers varies.

It is an object of the present invention to provide a device capable of detecting various amounts of light and various wavelengths of light.

It is another object of the invention to provide a device capable of storing various amounts of light and various wavelengths of light.

It is a further object of the invention to provide an electronic apparatus capable of performing arithmetic operations using light.

It is a yet other object of the invention to provide a device from which information stored therein can be readily read.

These objects are achieved in accordance with the teachings of the invention by a method consisting of illuminating a material satisfying certain conditions with first light to write information corresponding to the total energy of the first light. When the information is stored in the material, the information is read from the material by illuminating it with second light which satisfies given conditions by reading the information from a pulsed photocurrent induced in the material.

The aforementioned material satisfying the certain conditions has photoconductivity, an energy bandgap, and trap levels. An example of this material is a thin polycrystalline diamond film fabricated by a vapor phase method.

The aforementioned first light which satisfies the given conditions is required to have photon energies greater than the energy bandgap of the material satisfying the certain conditions. The aforementioned second light satisfying given conditions is required to have photon energies smaller than the energy bandgap of the material satisfying the certain conditions.

An example of the total energy of the first light is the amount of light (radiant intensity×irradiation time) which corresponds to the total irradiant energy per unit area expressed, for example in $\mu Ws/cm^2$.

A first aspect of the present invention lies in an electronic apparatus having a material which is illuminated with first light and illuminated with second light to induce a pulsed photocurrent in the material, thereby reading information about the first light. The material has photoconductivity, an energy bandgap, and trap levels. The first light has photon energies greater than the energy bandgap of the material. The second light has photon energies smaller than the energy bandgap of the material.

This apparatus makes use of the facts that photoconductivity is induced in the material by illumination of the second light and that its electrical resistance changes. At this time, a bias voltage is applied to the material. In this way, a pulsed photocurrent can be obtained. Information written with the first light can be read out by measuring the photocurrent. We can consider that measurement of the photocurrent is a means for measuring the resistance value attributed to the photoconductivity. In the configuration described above, the first light acts as writing light for writing information into the material. The second light serves as reading light for reading information from the material. The second light also acts to take out, or erase, information from the material.

As described already in the Background of the Invention, the present invention is based on the result of our experiment, i.e., the amount of the first light can be known from the photocurrent induced in the material by irradiation of the second light. When the apparatus is operated in practice, the maximum value, or peak value, of the pulsed photocurrent shown in FIG. 3 is measured, or the photocurrent is integrated with respect to time for a given time. The value obtained by integrating the photocurrent is given by $\int I(t)dt$, where $I(t)$ is the photocurrent. This value corresponds to the number of carriers promoted out of the trap levels in the material.

The photoconductivity means the following phenomenon. Electron-pair holes are generated by illumination of light. These electrons or positive holes act as carriers for conduction of electricity. The electrical resistance drops, i.e., the conductivity increases.

Examples of the above-described material which has photoconductivity, an energy bandgap, and trap levels include thin films of polycrystalline diamond. Other preferable materials are single-crystal diamond, SiC, and other semiconductor materials having wide bandgaps such as boron nitride, ZnO, ZnS, ZnSe, ZnTe, CdS, and AlN. Of course, other compound semiconductors having wide bandgaps may also be used. The conductivity types of these semiconductors can be any one of P type, I type, and N type. An appropriate type can be selected according to the need. Furthermore, impurities can be added to control their electrical characteristics such as conductivity and bandgap.

Also, Si, Ge, Se, AlAs, AlSb, GaP, GaAs, GaSb, InP, InAs, InSb, PbO, CsSe, CdTe, other compound semiconductors, and these materials to which impurities have been added can be employed. However, materials which are actually used preferably have a wide bandgap and a strong crystalline structure such as diamond. As an example, amorphous silicon is not desired because its physical properties are deteriorated when illuminated with intense light. Specifically, when the material is illuminated with second light, or reading light, the resistance of the material is varied by carriers excited out of the trap levels. In addition, the resistance is varied by a change in the quality of the material, e.g., deterioration or a change in the crystal structure such as crystallization, in other words, a structural change at a molecular level. As a result, the effects cannot be neglected.

A second aspect of the present invention is based on the first aspect described above and characterized in that the material is irradiated with second light after irradiated with the first light.

In the first aspect, the relation between the timing at which the first light is emitted and the timing at which the second light is emitted is not clear. When cause and effect are taken into account, it is obvious that the first light is not emitted after illumination of the second light. In this second aspect, the second light is illuminated after illumination of the first light so that information about the illumination of the first light is obtained.

A third aspect of the invention is based on the first aspect described above and characterized in that the material is illuminated with the first and second light simultaneously. In this scheme, information about the first light emitted before the illumination of the second light can be obtained.

A fourth aspect of the invention is based on the first aspect described above and characterized in that information about the first light impinging on the material is the amount of the first light impinging on the material. This amount of the first light falling on the material is read by illuminating the material with the second light, as indicated by the data obtained from a polycrystalline diamond, the data being shown in FIG. 6.

For example, a pair of electrodes are installed on the material. A bias voltage is applied between the electrodes. Under this condition, the first light is projected between the electrodes. Then, the material is illuminated with the second light. A photocurrent is induced between the electrodes. In this way, the relation between the amount of the first light and the peak value of the photocurrent can be known. Alternatively, the relation between the amount of the first light and a value obtained by integrating the photocurrent with respect to time can be known.

The photocurrent induced by the illumination of the second light takes a pulsed form as shown in FIG. 3. When the current is measured in practice, its peak value is measured, or the current is integrated for a given time. Then, the amount of the first light is calculated, using the relation (FIG. 6) previously set.

We can understand that the pulsed photocurrent measured as described above is a value obtained by integrating the photocurrent for an infinitesimal time ?t immediately after the photocurrent begins to flow. Also, we can consider that measurement of the photocurrent (I) is a measurement of the amount of charge, i.e., $\int I(t)dt=Q$. We can understand that this is a measurement of the number of carriers excited out of the trap levels in the material by the second light. The apparatus operating as described above can be regarded as a memory which receives the amount of the first light. Of course, the simplest operation is to know whether the material is illuminated with the first light or not by measuring the photocurrent induced by the second light. That is, binary data 0 and 1 can be treated.

The amount of light impinging on the material is defined as the product of the radiant intensity and the irradiation time. If the radiant intensity I depends on time, the amount of light is given by $\int I(t)dt$. For example, the amount of light is expressed in $\mu Ws/cm^2$. In the present specification the concept of the amount of light impinging on the material is chiefly used. If the irradiation time is limited to a unit time, the same discussion can be made, using the concept of the radiant intensity.

If the material is irradiated with the second light while irradiated with the first light, the integrated amount of the first light which is obtained by integrating the radiant intensity for an irradiation time before the illumination of the second light can be known from the value of the photocurrent.

A fifth aspect of the invention is based on the first aspect and characterized in that information about the first light impinging on the material relates to different wavelengths of the first light.

As already described in the Background of the Invention, we can conclude that what can be read with the second light is not limited to the amount of the first light. Information regarding different wavelengths can also be read. For example, where two kinds of light having the same amount of light but different wavelengths are used, different photocurrents are induced by them because their photon energies (hv) are different from each other. It is possible to judge which of the two kinds of light was emitted.

A sixth aspect of the invention is based on the first aspect described above and characterized in that the information about the first light impinging on the material is represented by combinations of wavelengths and amounts of the first light. For example, where the first light consists of two wavelengths of light having different irradiant intensities, plural combinations of these wavelengths and irradiant intensities can be used as information.

Preferably, the first light used in the above aspects has a single wavelength which can be specified. Examples of the first light include laser light, light emerging from a spectrograph, and light which has a strong spectrum in a certain wavelength region and thus can be regarded as having a single wavelength.

A seventh aspect of the invention is based on the first aspect described above and characterized in that the spectrum of the first light is used as information about the first light. Where the first light consists of two wavelengths of light having different spectra but the same amount of light, different total amounts ($\Sigma h\nu$) of photon energies are produced. As a result, these two kinds of light write different kinds of information into the material.

A special situation in which they have different spectra but the same total amount of light ($\Sigma h\nu$) may also be conceived. In this case, if their amounts of light are the same, it follows that the two kinds of light cannot be distinguished.

When two kinds of light having different wavelengths are used, it can be said that they have different spectra.

An eighth aspect of the invention is based on the first aspect described above and characterized in that the lower limit of wavelengths of the first light and the upper limit of wavelengths of the second light are determined by the photosensitivity of the material.

As already described in the Background of the Invention, the first aspect of the invention and associated aspects make use of the fact that the material has photosensitivity. Accordingly, where light having a wavelength to which the material does not respond cannot be used as the first or second light, expected results cannot be derived. Consequently, it is advantageous to select the first and second kinds of light from the wavelength region to which the material exhibits a practical photosensitivity.

For example, as shown in FIG. 1, a thin polycrystalline diamond film fabricated by microwave CVD in the presence of a magnetic field has a photosensitivity to a wavelength region from about 1.3 eV corresponding to a wavelength of about 950 nm to about 6.2 eV corresponding to a wavelength of about 200 nm. In this case, the first and second kinds of light can be selected from wavelengths contained in this region. It is to be noted that the value of photosensitivity determining the lower limit of wavelengths of the first light is not coincident with the value of photosensitivity determining the upper limit of wavelengths of the second light.

A ninth aspect of the present invention is based on the first aspect described above and characterized in that the material is diamond and that the lower limit of wavelengths of the first light and the upper limit of wavelengths of the second light are gamma ($\Gamma$) rays or X-rays and visible light or infrared light, respectively.

It is known that natural diamond has a photosensitivity even to radiation containing gamma rays and X-rays. Therefore, we think that diamond fabricated by CVD or a high-pressure method responds to gamma ($\Gamma$) rays and X-rays similarly to natural diamond.

Our experiment has demonstrated that a thin polycrystalline diamond film having a thickness of 15 μm and fabricated by a CVD process has a photosensitivity to infrared radiation having a wavelength of 1200 nm. Therefore, we conclude that the upper limit of wavelengths of the second light is in the infrared region.

A tenth aspect of the present invention is based on the first aspect described above and characterized in that the lower limit of wavelengths of the first light is in the UV range and that the upper limit of wavelengths of the second light is in the infrared region.

Except where a material having a wide bandgap such as diamond is used, the lower limit of wavelengths of the first light can be selected from the UV range or from the X-ray range or even from gamma rays. Of course, the lower limit of usable wavelengths may be limited by the material, the method of fabrication, and the presence or absence of an additive. In this case, it is necessary to determine the lower limit of the wavelengths empirically.

Preferably, the upper limit of wavelengths of the second light is in the infrared region. Of course, the accurate value of the upper limit of wavelengths of the second light differs according to the used material. Therefore, when the upper limit of wavelength is set in practice, it is necessary to judge whether a practically usable photosensitivity can be obtained. Furthermore, it is necessary to judge whether the required photocurrent is produced.

An eleventh aspect of the present invention is based on the first aspect described above and characterized in that the apparatus satisfies the following relations $$E_1 > E_g > E_2$$

where $E_1$ is the photon energy of the first light, $E_2$ is the photon energy of the second light, and $E_g$ is the energy bandgap of the material.

It is considered that light having a photon energy of $E_g$ acts as the second light simultaneously with the first light. In this case, the above relations are modified into the form $$E_1 \geq E_g \geq E_2$$

However, as shown in FIG. 1, $E_g$ has generally has no definite value, and it is impossible to determine the value. Therefore, in practical applications, $E_g$ is preferably allowed to have some range of values, and light satisfying the above relations is selected.

A twelfth aspect of the present invention is based on the first aspect described above and characterized in that the material is irradiated with the first light to write desired information into the material. That is, the desired information is carried by the first light and written into the material by means of the first light.

An example of imparting desired information to the first light is as follows. An amount 1000 μWs/cm$^2$ of the first light is made to correspond to information A. An amount 2000 μWs/cm$^2$ is made to correspond to information B. Non-illumination is made to correspond to information C. In this way, three kinds of information can be entered into the material. Of course, these three kinds of information can be discriminated from each other according to the value of the photocurrent induced by illumination of the second light.

A thirteenth aspect of the invention lies in an electronic apparatus for reading information about first light impinging on a material according to the electrical resistance of the material when it is irradiated with second light or according to a photocurrent induced in the material during this irradiation. The material has photoconductivity, an energy bandgap, and trap levels. The first light has photon energies greater than the energy bandgap of the material. The second light has photon energies smaller than the energy bandgap of the material. Desired information is written into the material by irradiating the material with the first light. The written information is accumulated and stored.

The thirteenth aspect of the invention is characterized in that information entered or written into the material by means of the first light is accumulatively stored in the material. Hence, the electronic apparatus acts as a memory.

For example, when the material is illuminated with the first light having a radiant intensity of 100 $\mu$Ws/cm$^2$ for 30 seconds. Information corresponding to an amount of light 3000 $\mu$Ws/cm$^2$ is stored in the material. Under this condition, the material is irradiated with the second light to induce a photocurrent in the material. The photocurrent is measured. In this way, an output corresponding to the amount of light 3000 $\mu$Ws/cm$^2$ can be obtained.

Where the radiant intensity I varies with time, I(t)dt is stored in the material as an integrated dose.

We now discuss another example. It is assumed that the material is not irradiated with the first light at all. Then, the material is irradiated with the first light with an amount of light of 1000 $\mu$Ws/cm$^2$. Under this condition, information corresponding to the amount of light 1000 $\mu$Ws/cm$^2$ is stored in the material. That is, the material is now irradiated with the second light, and the resulting photocurrent is measured. In consequence, an output corresponding to the amount of light 1000 $\mu$Ws/cm$^2$ of the first light is derived.

Then, the material is illuminated with the first light at an amount of light 1000 $\mu$Ws/cm$^2$ without emitting the second light. It follows that the material is irradiated with the first light at a total amount of light 2000 $\mu$W s/cm$^2$.

Under this condition, the material is irradiated with the second light, and the resulting photocurrent is measured. An output corresponding to the condition in which the material is irradiated with the first light at the amount of light 2000 $\mu$Ws/cm$^2$ can be produced.

In particular, if the first light having an amount of light 1000 $\mu$Ws/cm$^2$ is emitted twice, their amounts of light are accumulatively stored in the material. The accumulated amount of light can be read out. In this way, a memory can be accomplished.

A fourteenth aspect of the present invention lies in an electronic apparatus for reading information about first light impinging on the above-described material from a pulsed photocurrent according to the electrical resistance of the material when it is irradiated with second light. The material has photoconductivity, an energy bandgap, and trap levels. The first light has photon energies greater than the energy bandgap of the material. The second light has photon energies smaller than the energy bandgap of the material. Desired information is written into the material by irradiating it with the first light. The written information is accumulated and stored. Desired information can be fetched from the information accumulatively stored. When a pulsed light is used as the second light, such a pulsed photocurrent is obtained as an output.

In the fourteenth aspect described above, fetching of desired information means that information corresponding to an amount of light 1000 $\mu$Ws/cm$^2$ is erased from information corresponding to an amount of light 2000 $\mu$Ws/cm$^2$ entered by illumination of the first light. In this case, therefore, information remaining in the material corresponds to the amount of light 1000 $\mu$Ws/cm$^2$ of the first light.

In order to fetch information from the material, it is irradiated with the second light having a given amount of light. As previously described in the Background of the Invention in connection with FIGS. 3 and 7, information written into the material with the first light is reduced not a little by performing reading operations using illumination of the second light. Utilizing this phenomenon, information stored in the material can be erased. It is possible to erase the information partially rather than totally. That is, only desired pieces of information can be erased by irradiating the material with light having such an amount of light or wavelengths which can erase the desired pieces of information. The light must satisfy the conditions for the second light.

In the above example, information corresponding to the first light having the amount of light 1000 $\mu$Ws/cm$^2$ can be fetched from information corresponding to the amount of light 2000 $\mu$Ws/cm$^2$ already stored in the material by erasing information corresponding to the amount of light 1000 $\mu$Ws/cm$^2$. In this structure, desired information can be written and read. Specifically, information corresponding to the amount of light 1000 $\mu$Ws/cm$^2$ can be written into the material by irradiating the material with the first light having an amount of light 1000 $\mu$Ws/cm$^2$. Furthermore, the information corresponding to the amount of light 1000 $\mu$Ws/cm$^2$ can be taken out from the material by illuminating the material with the second light having such an amount of light which erases the amount of light 1000 $\mu$Ws/cm$^2$.

The following arithmetic operations can be performed by making use of the principle described above. The amount of light 1000 $\mu$Ws/cm$^2$ of the first light is made to correspond to one unit of information. First, the material is irradiated with the first light to write 5 units of information (corresponding to an amount of information 5000 $\mu$Ws/cm$^2$ of the first light) into the material. Then, the material is illuminated with the second light to fetch 2 units of information from the 5 units of information. As a result, 3 units of information remain in the material.

In the above description, the treated information is made to correspond to the amount of the first light. The information may also be made to correspond to various wavelengths of light. In this case, it is assumed that light having a wavelength of $x_1$ nm indicates information A and that light having a wavelength of $x_2$ nm indicates information B.

Also, combinations of various amounts and various wavelengths of the first light can be used to indicate various kinds of information. In this case, the first light having a wavelength of $x_1$ nm and an amount of light $y_1$ $\mu$Ws/cm$^2$ is made to correspond to information A. The first light having a wavelength $x_2$ nm and an amount of light $y_2$ $\mu$Ws/cm$^2$ is made to correspond to information B.

A fifteenth aspect of the present invention is based on the first aspect described above and characterized in that the material is irradiated with the first light of an amount which compensates for a decrease in the information stored in the information, the decrease taking place spontaneously or being caused when the material is irradiated with the second light.

In the fifteenth aspect of the invention, the material is irradiated with the first light to write desired information into the material. As already described in conjunction with FIGS. 3 and 7, the amount of information stored in the material decreases more or less by performing reading operations. Accordingly, if the amount of information lost by one reading operation is known, then the lost information can be recovered by illumination of the first light. That is, if information about the lost information is written, then the apparent amount of information is retained constant.

As mentioned above, desired information is written by illumination of the first light and desired information can be taken out or erased by illumination of the second light. This makes use of the fact that illumination of the second light causes a part of the information stored in the material to be taken out. Conversely, information corresponding to the information taken out can be written into the material by illumination of the first light.

An example of operation is described now. First, five pieces of information $A_1=100$ μWs/cm$^2$, $A_2=200$ μWs/cm$^2$, $A_3=300$ μWs/cm$^2$, $A_4=400$ μWs/cm$^2$, and $A_5=500$ μWs/cm$^2$ are established, corresponding to amounts of the first light. It is assumed that information $A_1$ is stored in the material. The material is irradiated with the second light, and the resulting photocurrent is measured. In this way, the information $A_1$ is read out. If the subsequent reading operation is performed, the amount of the photocurrent will be reduced more or less.

Of course, if weak pulsed light having a long wavelength is used as the second light, the difference between the photocurrents respectively induced by two reading operations is so small that it can be neglected. That is, the decrease in the photocurrent encountered in the second reading operation can be almost neglected.

We assume that information corresponding to the amount of light 20 μWs/cm$^2$ of the first light is lost due to the operation for reading out the information $A_1$. It is also possible to consider that the information is erased or taken out. Specifically, if the information $A_1$ is read out and subsequently the same information $A_1$ is again read out, then the output, or the photocurrent induced by the second light, produced during the second reading operation corresponds to an amount of light 80 μWs/cm$^2$ of the first light.

Accordingly, after the information $A_1$ is read out, the material is irradiated with the first light having an amount of light of 20 μWs/cm$^2$, so that the information $A_1$ is retained. Other information can be retained in the same way. Where each different piece of information is treated in this way, it is desired to previously measure the amount of decrease of information when each different piece of information is read out.

Our fundamental experiment has proved that information once written decreases if it is allowed to stand for a long time, or tens of hours. Therefore, where a writing operation and a reading operation are performed at a long interval, it is necessary to compensate for the loss. Also in this case, it is desired to previously measure the amount of loss produced after a lapse of a given time and to irradiate the material with the first light having the amount of light corresponding to the amount of loss so as to retain the information. The intervals at which the material is illuminated with the first light to retain the information stored in the material are set to microseconds to tens of hours, depending on the manner in which information is written and read and on the kind of the material.

In the description made thus far, given information is retained by illuminating the material with the first light having the corresponding amount of light. The means for writing desired information into the material is not limited to the amount of the first light. For example, desired information may be written by changing the wavelength. The operation described above may be carried out by using light of an appropriate wavelength having an appropriate amount of light as the first light.

Let us assume that the first light acting as writing light has a wavelength of $x_1$ nm and an amount of light of $y_1$ μWs/cm$^2$. In the above description, lost information is compensated for, using light having a wavelength of $x_1$ nm. However, in principle, light having a wavelength (e.g., $x_2$ nm) different from the wavelength $x_1$ nm can act in the same way if the light satisfies the conditions for the first light. In this case, the amount of light of the wavelength $x_2$ nm is so set that carriers approximate in number to the carriers produced in the case of illumination of the wavelength $x_1$ nm may be trapped in the trap levels in the material.

A sixteenth aspect of the invention is based on the first aspect described above and characterized in that the material has a junction between dissimilar conductivity types or a Schottky junction.

Photodiodes and phototransistors are well known as devices for detecting light. These devices efficiently take out carriers produced in response to light illumination, by making use of the action of an internal electric field produced by a junction between dissimilar semiconductors such as a PN junction.

A straightforward method of obtaining a photocurrent is to apply a bias voltage to the material as described above. A method of efficiently directing carriers optically generated to electrodes can utilize a junction between dissimilar conductivity types. Examples of the junction between dissimilar conductivity types include PN junction, IN junction, IP junction, and PIN junction. Besides the junctions between dissimilar conductivity types described above, a Schottky junction 201 (as shown in FIG. 2(d)) can be used.

A seventeenth aspect of the invention lies in an electronic apparatus having a material which has photoconductivity, an energy bandgap, and trap levels. The material is provided with a plurality of device regions into which desired information can be written. The electronic apparatus is further equipped with a means for irradiating the device regions with first light, a means for irradiating the device regions with second light, and a means for measuring a pulsed current induced in the device regions. The first light has photon energies greater than the energy bandgap of the material. The second light has photon energies smaller than the energy bandgap of the material.

In the aforementioned seventeenth aspect, each one device region can be regarded as an electron apparatus defined by the first aspect. Therefore, the structures of the other aspects described thus far can be applied to these device regions. As described above, the electronic apparatus can act as a sensor, a memory, or a calculator for treating information corresponding to amounts of the first light, information corresponding to various wavelengths of the first light, information corresponding to combinations of amounts of the first light and various wavelengths, or information corresponding to various spectra of the first light. In the seventeenth aspect, the electronic apparatus is equipped with a plurality of devices having such functions. Hence, the apparatus can treat complex information. Therefore, the components are similar to the components described already unless otherwise stated.

In the seventeenth aspect described above, "the means for measuring the pulsed current induced in the device regions" comprises a pair of electrodes mounted on the device regions, a bias voltage source for applying a bias voltage between the electrodes, a voltmeter for converting an induced electrical current into a voltage and measuring the voltage, a determining means for determining the value of the photocurrent from the voltage measured by the voltmeter, a means for integrating the value determined by the determining means, and other requisite arithmetic units and memories.

An eighteenth aspect of the invention lies in a method comprising the steps of: irradiating the device regions with first light to write desired information into the device regions; and irradiating the device regions with second light to take out or read desired pieces of information from the device regions.

To take out desired pieces of information is to erase desired pieces of information by irradiating the material with the second light or light satisfying the conditions for the second light. The irradiation of the second light excites carriers trapped in the trap levels in the device regions, thereby reducing the amount of information retained.

To read desired pieces of information is to read information, for example corresponding to the amount of the first light, by irradiating the material with the second light and measuring the induced photocurrent.

The above-described structure permits fabrication of an electronic apparatus capable of writing desired pieces of information into plural device regions and reading or taking out desired pieces of information from the device regions. This electronic device is characterized in that information can be accumulatively stored in the device regions. Also, the information can be taken out, or erased, and written at will. In addition, accumulatively stored information can be read out.

An example of the structure in which plural device regions are formed on the material is shown in FIG. 8, where a plurality of device regions $A_{mn}$ are arranged in rows and columns on the surface of a thin-film material such as a thin-film polycrystalline diamond.

We now discuss a situation in which one device region treats information corresponding to the amount of the first light. The amount of light 1000 $\mu$Ws/cm$^2$ of the first light is taken as a unit of information. Information from 0 unit to three units is treated. In particular, 0 unit of information corresponds to the state in which the device region is not irradiated with the first light. One unit of information corresponds to the amount of light 1000 $\mu$Ws/cm$^2$ of the first light. Two units of information correspond to the amount of light 2000 $\mu$Ws/cm$^2$ of the first light. Three units of information correspond to the amount of light 3000 $\mu$Ws/cm$^2$ of the first light. In this case, if one unit of information is written twice consecutively, then two units of information are written into the device region. If the device region in which the two units of information are stored is irradiated with the second light to take out one unit of information, then the information remaining in the device region is one unit.

In this case, four kinds of information, from 0 to 3 units, are treated in the m×n device regions arranged in rows and columns. Therefore, an m×n matrix can be calculated. Also, information represented by a two-dimensional image can be treated while taking information written into each one device region as a pixel.

The above-described structure treats information about a matrix array. If each one device region is several micrometers square, each one device region can be treated as a pixel. In this way, image information can be created. We now discuss a situation in which three units of information are treated on the device regions although these units of information cannot be recognized visually. One unit of information is made to correspond to black. Two units of information are made to correspond to a halftone between black and white. Three units of information are made to correspond to white. These units of information are combined on a two-dimensional plane, whereby information about a black-and-white image is created.

Also, plural pieces of image information can be subjected to an additive or subtractive operation. This corresponds to summation of plural pieces of image information and difference between them. Using these operations, plural pieces of information about image can be arithmetically operated.

Where information about a matrix or an image is arithmetically treated, an additive operation is performed by irradiating the material with the first light. A subtractive operation is performed by irradiating the material with the second light.

A summation of information is to accumulate information in one device region. This is realized by irradiating the material with the first light. A subtraction is to take out information from the device region. This is achieved by irradiating the material with the second light. Of course, the amount of the first light or the amount of the second light necessary to add or subtract desired information is required to be predetermined. For example, the amount of the second light necessary to take out information corresponding to the amount 1000 $\mu$Ws/cm$^2$ of the first light is required to be set in advance.

In the above-described structure, light for reading information may be different from light for taking out information. For example, in order to minimize the decrease in the amount of information caused by a reading operation, the reading light has a longer wavelength, while the light used to take out information has a shorter wavelength, for obtaining a desired photon energy.

Let us assume that information stored in one device region is indicated by z-axis and that a plane formed by plural device regions is indicated by x- and y-axes. Thus, information expressed by a three-dimensional image can be treated.

Weighted pieces of information can be accumulatively written into each one device region. Device regions formed on a two-dimensional plane create two-dimensional information. Information stored in each device region is used as one-dimensional information. In this way, information corresponding to a three-dimensional image can be created. Each piece of information about the three-dimensional image can be added to or subtracted from other information.

It is advantageous to arrange means for emitting the first light in rows and columns in conformity with the matrix arrangement of the device regions.

The speeds at which information is written and read can be effectively increased by providing light-emitting means corresponding to the device regions, respectively. That is, where the device regions are arranged in rows and columns, arithmetic operations can be performed at higher speeds by arranging first light-emitting means also in rows and columns.

The speeds of arithmetic operations can be further increased by arranging second light-emitting means in rows and columns.

The first or second light-emitting means arranged in rows and columns can be semiconductor lasers corresponding to the device regions, respectively, or optical fibers or optical waveguides for guiding light from one or more light sources to the device regions.

A nineteenth aspect of the present invention lies in an electronic apparatus for irradiating a material with first light and then irradiating the material with second light to induce a pulsed photocurrent in the material. The apparatus is characterized in that it utilizes the fact that the amount of the first light is in proportion to the pulsed photocurrent. The material has photoconductivity, an energy bandgap, and trap levels. The first light has photon energies greater than the energy bandgap of the material. The second light has photon energies smaller than the energy bandgap of the material.

The nineteenth aspect described above makes use of the fact that the amount of light impinging on the material is in proportion to the peak value of the photocurrent induced by the second light impinging on the material or to a value obtained by integrating the photocurrent for a given time, as shown in FIG. 6. This aspect can be applied to photosensors, optical memories, and optical arithmetic devices.

The nineteenth aspect is also characterized in that information about the first light having a wavelength corresponding to an energy higher than the energy bandgap of the material is obtained from a change in a physical change in the material caused by illumination of the second light having a wavelength corresponding to an energy smaller than the energy bandgap of the material.

The change in the physical property of the material are attributed to carriers excited by the energy of the second light in the material. The change in the physical property of the material brings about a change in the electrical resistance of the material, or a photovoltaic effect. In order to electrically read the change in the physical property, the material is irradiated with the second light while a bias voltage is applied between a pair of electrodes. A pulsed photocurrent induced across the electrodes is measured.

First, the material is irradiated with the first light having a wavelength corresponding to an energy higher than the energy bandgap of the material. At this time, information about the first light is stored in the material.

During or after this irradiation, the material is irradiated with the second light having a wavelength corresponding to an energy lower than the bandgap of the material. A pulsed photocurrent induced at this time is measured. In this manner, information about the first light impinging on the material before the measurement can be obtained. Especially, with respect to the amount of the first light, the amount can be read accurately.

Also, desired information can be taken out, or erased, by irradiating the material with the second light. By utilizing this, information can be written by irradiating the material with the first light. Information can be taken out by irradiating the material with the second light. In this manner, addition and subtraction of information can be done. Information stored in the material can be read by measuring the pulsed photocurrent induced by the illumination of the second light.

Other objects and features of the invention will appear in the course of the description thereof, which follows.

BRIEF DESCRIPTION OF THE DRAWINGS

FIG. 3 is a diagram showing the relation of photocurrent to irradiation time when the ultraviolet detector shown in FIGS. 2 (a) and 2(b) is irradiated with ultraviolet radiation, as well as photocurrent induced by subsequent illumination of white light;

FIG. 13 is a schematic cross section of a yet other electronic apparatus according to the invention;

DETAILED DESCRIPTION OF THE INVENTION

Figure 1:
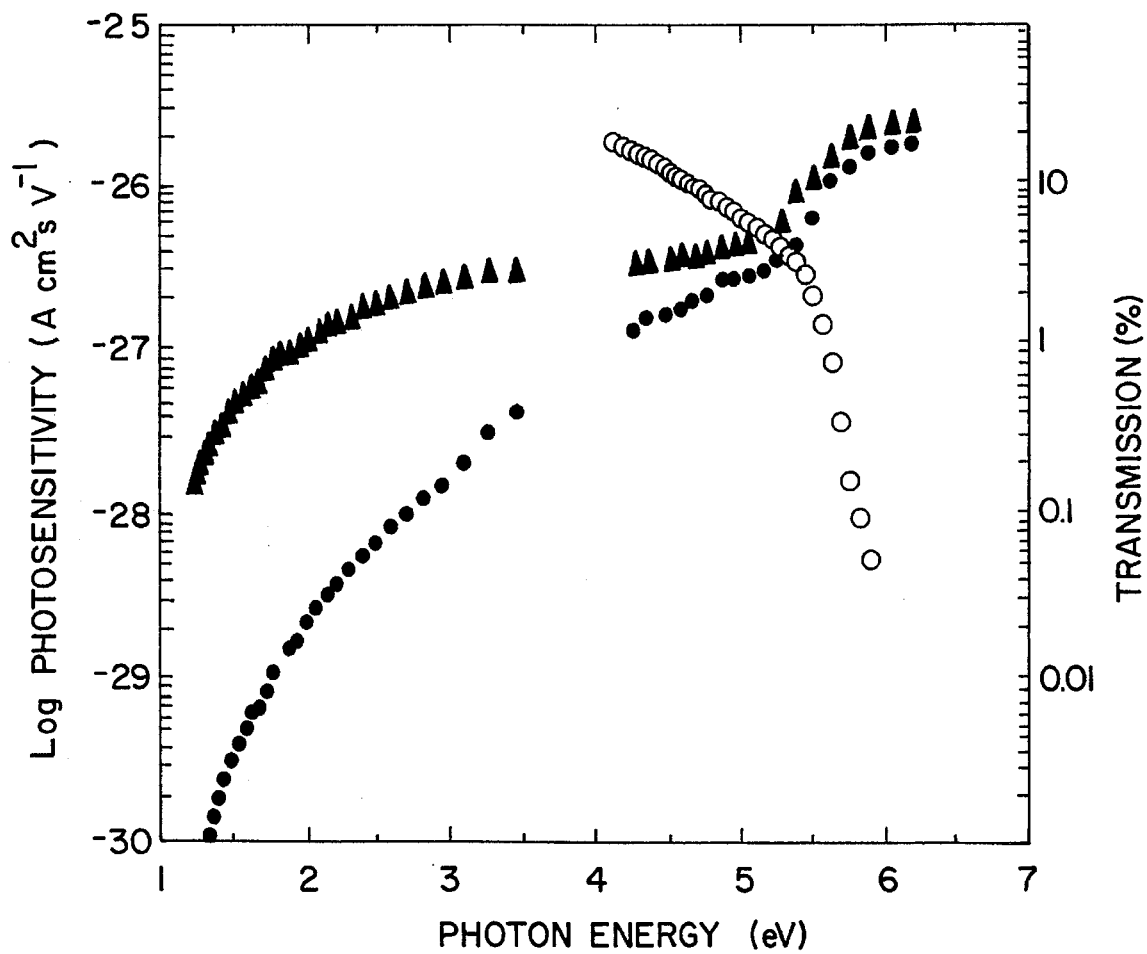
FIG. 1 is a graph showing the relation of the photosensitivity of a thin diamond film to energies corresponding to wavelengths of light when the diamond film is illuminated with the light.

In the following examples, a diamond is used as the material described above. Any other material may also be essentially used in the following examples instead of diamond if the conditions (a)–(c) described above are met. In the following examples, even where a material other than diamond is used, the following relations must be essentially satisfied:

$$E_2 < E_g < E_1$$

where $E_g$ is the energy bandgap of the energy, $E_1$ is the energy corresponding to the wavelength of the first light, or writing light, and $E_2$ is the energy of the wavelength of the second light, or reading light. Where one of the two kinds of light contains wavelengths which do not satisfy the above relations, if the energy of this light is smaller than that of the other light and the effects of this light can be neglected or permitted, then this light containing wavelengths which do not satisfy the above relations can be employed.

EXAMPLE 1

Referring to FIGS. 2, (a) and (b), there is shown a UV detector according to the invention. FIG. 2(a) is a top view of the UV detector. FIG. 2(b) is a cross-sectional view taken on line A–A' of FIG. 2(a). This detector comprises a thin diamond film 21, a pair of electrodes 22, 23, and a pair of output electrodes 24 and 25.

The thin diamond film 21 has a thickness of 15 μm and measures 1 mm×1 mm. This film was fabricated by microwave CVD in the presence of a magnetic field under the following conditions:

| raw material: | gaseous mixture of methyl alcohol and hydrogen |
|---|---|
| substrate: | silicon substrate |
| substrate temperature: | 800° C. |
| microwave output: | 4 kW (2.45 GHz) |

Generally, a thin diamond film fabricated by CVD has a polycrystalline structure and a large energy bandgap. Therefore, the thin diamond film is well adapted for the present invention.

Under the above conditions, a thin diamond film was formed to a thickness of 15 μm on the silicon substrate by making use of the interaction between the magnetic field and the microwave of 2.45 GHz. The diamond film was peeled off from the substrate to obtain a simple, thin diamond film. This was sliced into a size 1 mm square. In this way, the thin diamond film 21 shown in FIGS. 2, (a) and (b), was obtained. Then, the electrodes 22, 23, and the output electrodes 24, 25 were formed, thus completing the UV detector. The electrodes 22 and 23 are spaced 0.7 mm from each other. The specific resistance of the diamond film 21 was in excess of $10^{12}$ Ωcm. Any impurity which would normally impart a conductivity type was not implanted. Consequently, this thin diamond film is a substantially genuine diamond film.

EXAMPLE 2

Figure 2A:
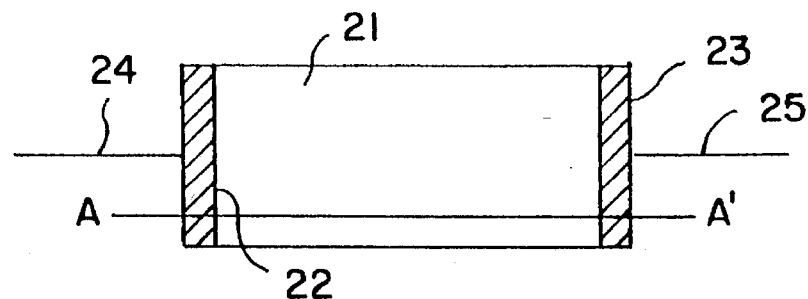
FIGS. 2(a) and 2(b) are cross sections of an ultraviolet detector used in an electronic apparatus according to the invention.
Figure 2B:
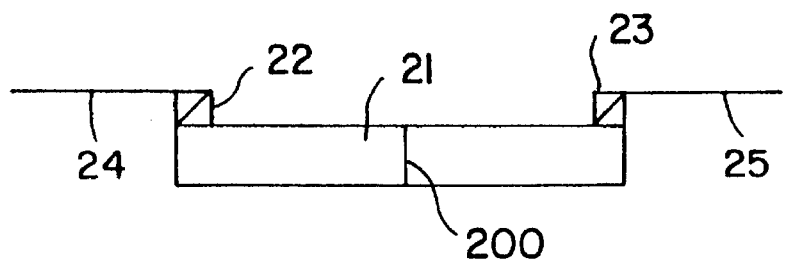
Figure 2C:
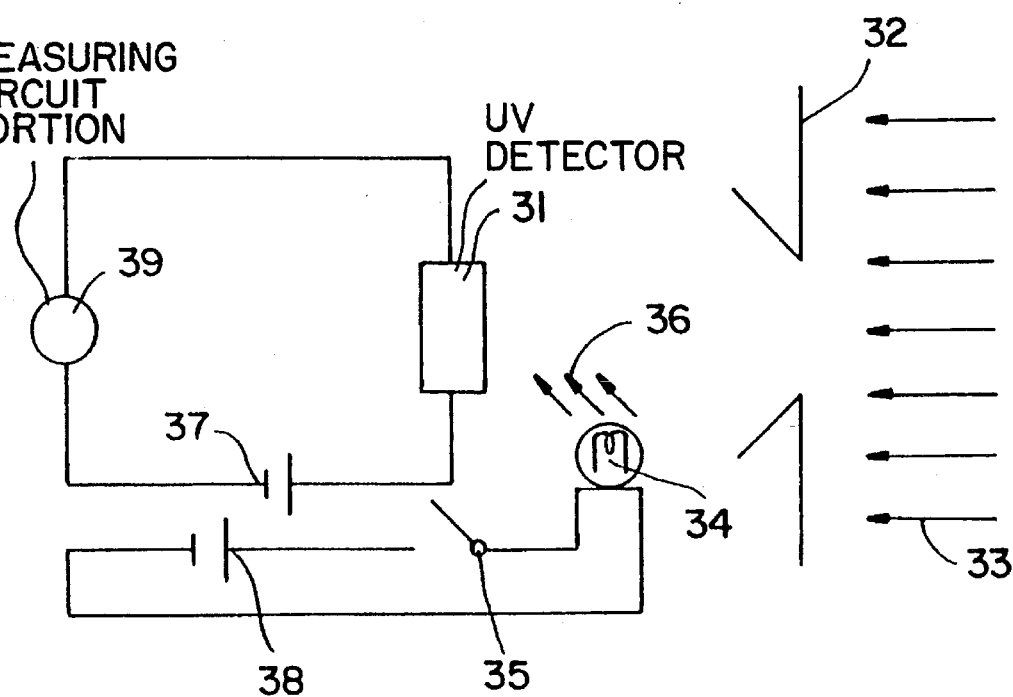
FIG. 2(c) is a schematic diagram of an ultraviolet dosimeter using the ultraviolet detector shown in FIGS. 2(a) and 2(b)
Figure 2D:
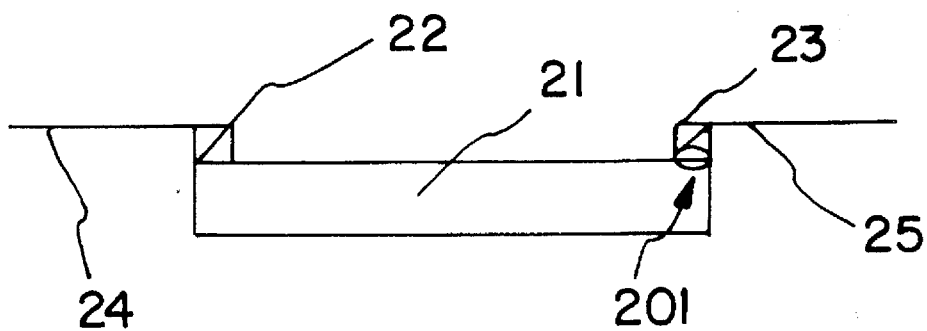
FIG. 2(d) is a cross section of a detector with a Schottky junction.
Figure 4:
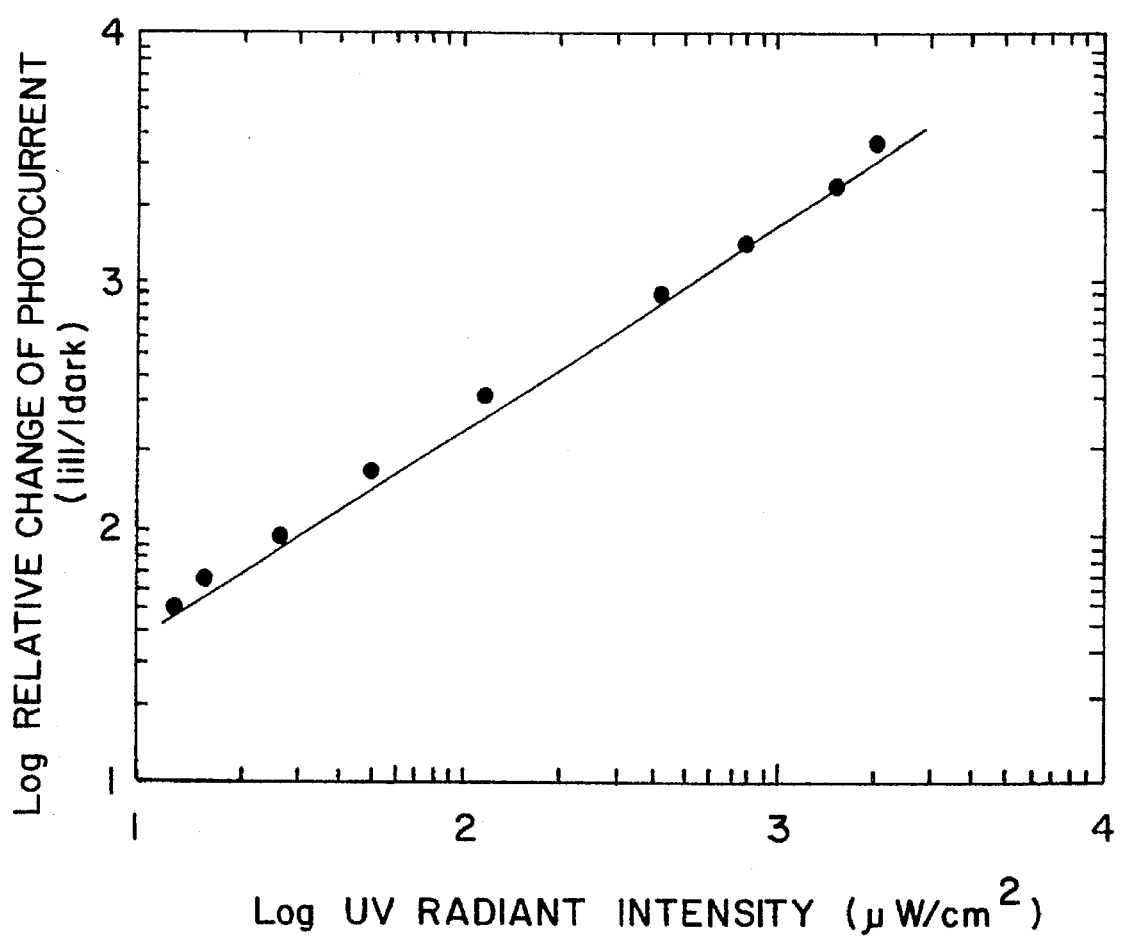
FIG. 4 is a diagram showing the relation of the photocurrent ratio to the UV radiant intensity when the ultraviolet detector shown in FIGS. 2(a) and 2(b) is irradiated with ultraviolet radiation, the photocurrent ratio being the ratio of photocurrent induced in illuminated state to photocurrent induced in dark state.
Figure 5:
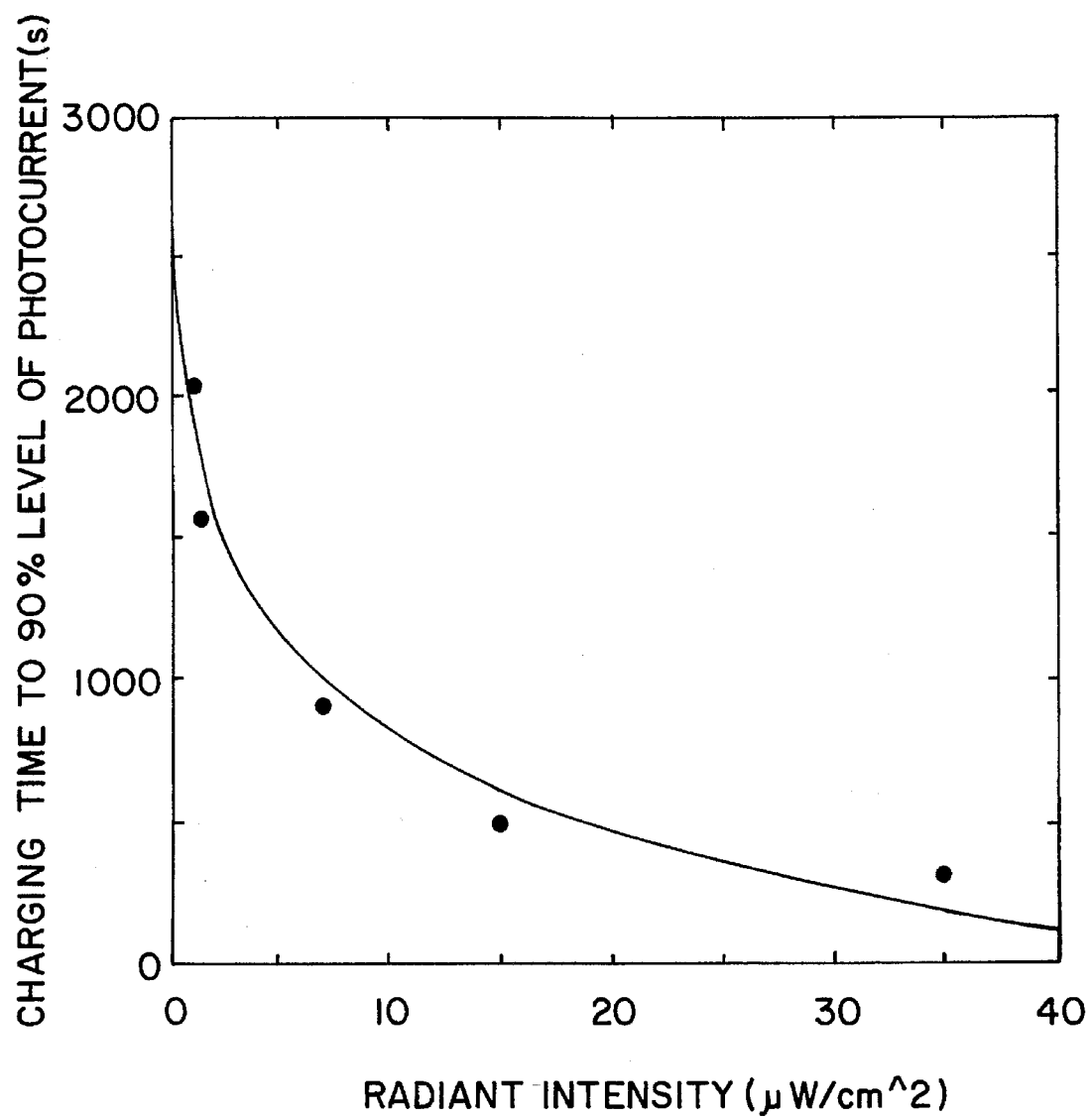
FIG. 5 is a diagram showing the relation of the time taken for photocurrent to reach 90% of the peak level to the radiant intensity when the ultraviolet detector shown in FIGS. 2(a) and 2(b) is irradiated with ultraviolet radiation.

FIG. 2(c) shows a UV dosimeter system using the UV detector of Example 1. This dosimeter system is constructed as shown in FIG. 2(c). The system from which the experimental data shown in FIGS. 1 and 3 to 7 have been obtained is based on the fundamental structure of the present invention described below.

FIG. 2(c) shows the UV dosimeter using the device of Example 1. The system shown in FIG. 2(c) comprises the UV detector 31 shown in FIGS. 2, (a) and (b), a shutter 32 for blocking UV light 33 directed to the UV detector 31, a tungsten-halogen lamp 34 for illuminating the UV detector 31 with reading light 36 consisting of white light for reading the amount of UV light falling on the UV detector 31, a switch 35 for turning on and off the tungsten-halogen lamp, a voltage source 37 for applying a bias voltage to the device 31, a power supply 38 for the tungsten-halogen lamp 34, and a measuring circuit portion 39 for detecting a photocurrent induced in the device 31.

The measuring circuit portion 39 incorporates an amplifier for amplifying signals, an arithmetic portion for measuring the peak value of the photocurrent or the total amount of the photocurrent induced for a given time and calculating the amount of the UV light impinging on the UV detector 31 from the results of the measurement, a first memory in which conditions necessary to perform these arithmetic operations are stored, and a second memory for recording results of measurements at given intervals of time. The tungsten-halogen lamp 34 is designed to emit white light at regular intervals of time.

The UV dosimeter shown in FIG. 2(c) is able to measure UV radiation having wavelengths shorter than about 230 nm corresponding to 5.5 eV that is the energy bandgap of the thin diamond film 21.

Figure 6:
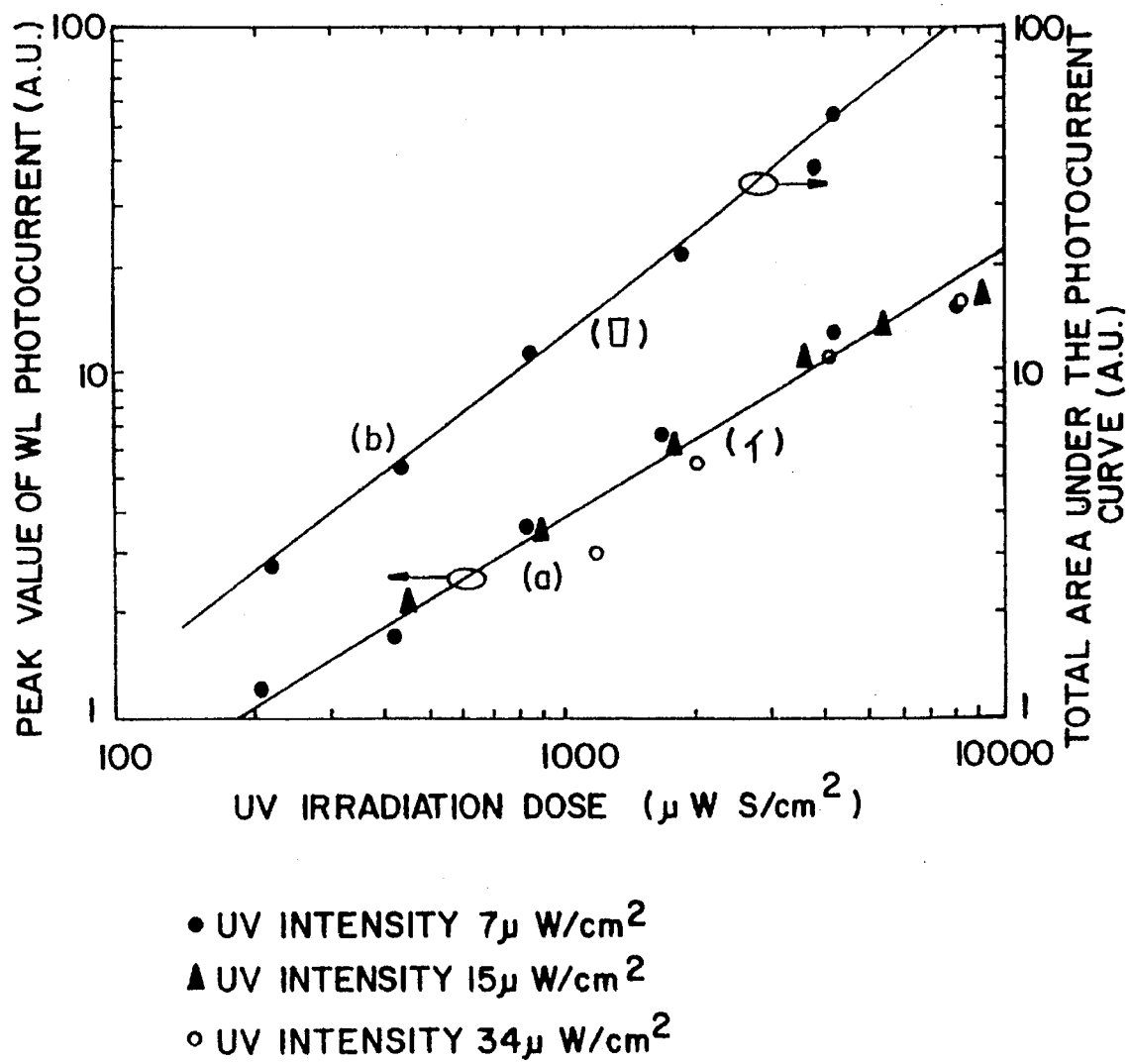
FIG. 6 is a diagram showing the relation of the peak value of photocurrent induced by illumination of white light to the UV dose of the ultraviolet detector shown in FIGS. 2(a) and 2(b) when it is irradiated with ultraviolet radiation.

This UV dosimeter operates in the manner described below. Before the operation, the relation between the amount of UV light to be measured and the photocurrent detected by the measuring circuit portion 39 is measured and stored in the first memory. This relation is a proportional relation as shown in FIG. 6, where a deuterium discharge lamp is used, of course, as a UV light source. Obviously, the proportional relation differs, depending on the environment in which measurements are made, on the spectrum of the light whose amount is to be measured, and on other factors. In the present example, diamond is used as the device 31. Where other material is used as the device 31, it is also necessary to previously examine the relation shown in FIG. 6.

It is assumed that the intensity spectrum of the UV light, i.e., the intensity distribution of light with respect to wavelength, hardly varies and that only the amount of the UV light changes, for the following reason. If the intensity spectrum of the UV light varies, the value of the photocurrent induced by illumination of white light is affected. In this case, the photocurrent induced by illumination of white light fails to depend only on the amount of the UV light because the total energy of the UV light impinging on the film depends not only on the amount of light but also on the energies of the wavelengths.

In the operation, this UV dosimeter is first installed in a location where the amount of the UV light should be measured. The shutter 32 is opened for a given time to expose the UV detector 31 to UV light 33. Then, the shutter 32 is closed, and the tungsten-halogen lamp 34 is lit up. At this time, a photocurrent is induced in the device 31. The peak value of the photocurrent or the total amount of the photocurrent flowed for a given time is measured by the measuring circuit portion 39 and compared with the above-described relation between amounts of UV light and the photocurrent, the relation being previously stored in the second memory. The amount of the illuminating UV light 33 is calculated from the photocurrent measured actually. If necessary, the calculated amount of UV light is stored in the second memory. If the times for which the shutter is opened and closed, respectively, have been previously set, then the average radiant intensity of the UV light 33 can be known. Since the lamp 34 is emitting white light, information about the amount of the UV light 33 stored in the device 31 is erased simultaneously with reading, by appropriately selecting the intensity and the irradiation time of the white light. Therefore, the amount of irradiation can be measured at regular intervals of time by appropriately setting the times for which the shutter 32 is opened and closed, respectively, the intervals at which the shutter 32 is opened or closed, the time for which the tungsten-halogen lamp is lit up, and the intervals at which the lamp is lit up.

Furthermore, rapid variations in the amount of the illuminating UV light 33 or in the radiant intensity can be detected by setting short the intervals at which the shutter 32 is opened and closed, setting short the intervals at which the tungsten-halogen lamp 34 is turned on and off, and measuring the amount of the illuminating UV light at shorter intervals of time. Of course, the intensity of the UV light can also be measured.

The operations described thus far can be performed by a simple electronic circuit made up of the arithmetic circuit and semiconductor memories incorporated in the measuring circuit portion 39. In the above-described structure, the amount of the UV light can be measured by turning on and off the tungsten-halogen lamp 34 while the UV detector 31 is being exposed to the UV light 33 without opening and closing the shutter 32. In this case, the device is irradiated with the white light while irradiated with the UV light. The relation between the amount of the illuminating UV light and the photocurrent induced by the illumination of the white light is previously examined. The results are stored in the semiconductor memory or the like.

In the configuration described above, white light from the tungsten-halogen lamp 34 is used as reading light. For example, if a light source emitting a single wavelength such as visible light semiconductor laser is used instead of the lamp 34, and if pulsed light is used as reading light, then information about the amount of UV light written into the UV detector 31 can be read out plural times without erasing the information regarding the amount of UV light. Although the present invention pertains to an apparatus for detecting UV light, this apparatus can also measure X-rays and gamma rays having wavelengths shorter than those of UV light by the same configuration and by the same method of operation.

The experimental data shown in FIGS. 1 and 3 to 7 have been obtained where the above-described deuterium discharge lamp is used as a UV light source inside a room in which fluorescent lamps are lit up, i.e., the brightness inside the room is at an ordinary level. The light from the fluorescent lamp is not blocked. That is, where ordinary white light having wavelengths longer than about 400 nm falls on the novel electronic apparatus, its operation is by no means hindered.

The apparatus is irradiated with the UV light 33 from the deuterium discharge lamp while irradiated with the white light, or reading light, from the tungsten-halogen lamp 34. Also, the device 31 is illuminated with strong white light guided by optical fibers. Also in this case, the data shown in FIG. 6 is obtained. That is, when the device is being exposed to the white light, the amount of the UV light can be read by illumination of the white light acting as reading light. However, the induced photocurrent is small.

Therefore, where a great dynamic range is not required, the device can be used as a UV dosimeter in an environment where light having wavelengths longer than the wavelengths of UV light falls. That is, where light acting as reading light falls, the amount of UV light having wavelengths shorter than about 230 nm can be selectively measured without using a special filter.

However, as can be seen from the experiment using the mercury lamp having a strong spectrum in a wavelength range longer than 250 nm, it is difficult to determine the amount of light having wavelengths shorter than about 230 nm from light having a strong spectrum in a wavelength range, for example, from 200 to 400 nm.

The data shown in FIGS. 1 and 3 to 7 have been calculated in the manner described now. In the configuration indicated by the measuring circuit portion 39 shown in FIG. 2(*c*), the photocurrent is amplified by an operational amplifier, and the amplified photocurrent is converted into a voltage by a resistor. This voltage is measured and delivered from a plotter. In this way, numerical values shown in FIGS. 1 and 3 to 7 are calculated from the values from the plotter.

In the present example, the device can be used as an apparatus for detecting UV light having a single wavelength shorter than about 230 nm. Assuming that light having a wavelength of 160 nm and light having a wavelength of 200 nm are produced, the following operations can be performed:

(a) After the device 31 is illuminated with these two kinds of light having the same amount of light, the tungsten-halogen lamp 34 emits white light. The resulting photocurrents are measured and stored in a memory.

(b) The UV detector device 31 is illuminated with either the light having a wavelength of 160 nm or light having a wavelength of 200 nm.

(c) The device 31 is illuminated with the white light emitted from the tungsten-halogen lamp 34. The resulting photocurrent is measured by the measuring circuit portion 39.

(d) Previously stored values of photocurrent are compared with actually measured values of photocurrent, more correctly, its peak value or the total amount of the photocurrent within a given time. Thus, it is possible to know whether the light of wavelength 160 nm or the light of wavelength 200 nm has been emitted.

EXAMPLE 3

In the present example, the UV dosimeter of Example 2 is used in practice. The UV dosimeter shown in FIG. 2(*c*) can be made compact and can be operated with a small amount of electric power consumed. Hence, a small-sized, portable UV dosimeter can be built.

Contemplated examples of usage of this UV dosimeter are as follows.

(A) This is used as a dosimeter which can be carried by a person in locations where he or she might be adversely affected by UV light. The dosimeter is used to measure the UV dose at regular intervals of time or to measure the total UV dose.

(B) It is known that UV light is used to sterilize foods and foodstuffs. The UV dosimeter is used as a dosimeter for measuring the amount of the UV light.

(C) The UV dosimeter is used as a dosimeter for measuring the amount of UV light in the outer space.

Where the usage (A) described above is considered, the effects of reading light having wavelengths longer than about 230 nm present problems. In the present invention, therefore, the shutter 32 shown in FIG. 2(C) is equipped with a filter which transmits light having wavelengths shorter than about 230 nm and attenuates light having wavelengths longer than about 230 nm, to prevent the UV detector 31 from being illuminated with light having wavelengths longer than about 230 nm or to attenuate the light of wavelengths longer than about 230 nm to a practically permissible level when the detector is being illuminated with UV light having wavelengths shorter than about 230 nm.

In this structure, the amount of UV light having wavelengths shorter than about 230 nm can be measured precisely. The method of operation is the same as the method described in connection with Example 2.

In the present example, this filter is made of a copper plate which transmits light having wavelengths corresponding to energies higher than 5.5 eV and reflects light having wavelengths corresponding to energies lower than 5.5 eV.

To impart the above-described property to the copper plate, the number of free electrons in the copper is controlled. Specifically, during fabrication of the copper plate, the annealing step is controlled for this purpose. The frequency of the boundary between reflection and transmission of electromagnetic waves or light is determined by the kind of free electron metal and by the method of fabrication. The required frequency is selected, and the filter is fabricated. Furthermore, a filter transmitting certain frequencies may also be used.

In the polar regions where the effects of UV light present problems due to destruction of the ozone layer, the structure of the present example permits fabrication of a UV dosimeter for measuring the amount of UV radiation having wavelengths shorter than about 230 nm without being affected by light having wavelengths corresponding to energies smaller than the bandgap of diamond. Since the structure of the present example can, in principle, detect X-rays and gamma rays, the structure can be used in medical applications.

EXAMPLE 4

The present example relates to an electronic apparatus equipped with a memory from which information can be read and written by the use of reading light and writing light, respectively. UV light having wavelengths shorter than about 230 nm, i.e., having energies greater than about 5.5 eV, is used as the writing light. Light having wavelengths longer than about 230 nm is used as the reading light. As described later, this electronic apparatus can also be used as an arithmetic device.

In the present example, it is possible to know whether the thin diamond film is irradiated with UV light, i.e., whether the irradiation is ON or OFF. Also, information about the amount of UV light can be read. Fundamental data on the amount of UV light is shown in FIG. 6. Consequently, information about various amounts of UV light can be treated.

Figure 8A:
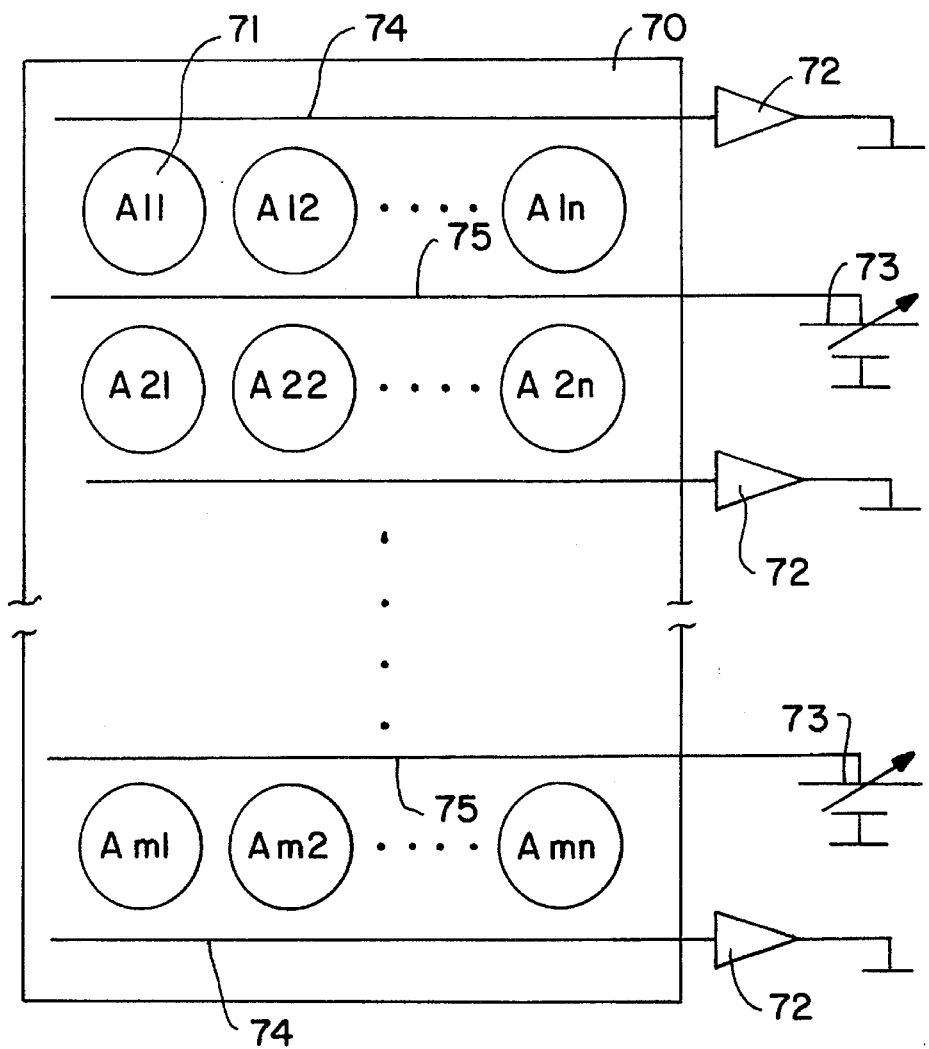
FIG. 8(a) is a schematic diagram of an electronic device according to the invention.

The present example is schematically shown in FIG. 8(a), where plural device regions 71 formed on a thin diamond film 70 for forming memory regions, reading interconnects 74, feeding interconnects 75, a current amplifier 72 for amplifying and measuring a photocurrent induced in the memory regions 71, and a voltage source 73 for applying a voltage between the feeding interconnects 75 and the reading interconnects 74 are shown. Voltages are applied across the memory regions 71 on the diamond film between the reading interconnects 74 and the feeding interconnects 75. The current amplifier 72 is capable of measuring the peak value of the photocurrent, calculating the amount of UV light falling on the memory regions 71 from the peak value of the photocurrent, and calculating stored information from the calculated amount of UV light. Of course, the current amplifier 72 can also be designed to measure the total amount of the photocurrent flowing through the device regions 71 for a given time rather than the peak value of the photocurrent.

The thin diamond film is fabricated by microwave CVD in the presence of a magnetic field in the same way as in Example 1. Other chemical vapor deposition methods and synthetic methods may also be used. The thin film 70 is made of substantially genuine diamond in which any impurity for imparting one conductivity type has not been implanted.

In the operation, the memory regions 71 are irradiated with UV light. Information according to the amount of the irradiating UV light is written. To read out the information, the device regions 71 are illuminated with laser light or the like having a wavelength longer than 230 nm. The photocurrent induced in the device regions 71 is detected by the current amplifier. In this way, the information previously written can be read out.

As an example, the reading interconnects 74 and the feeding interconnects 75 are arranged alternately such that the device regions 71 are spaced more than 3 µm from each other. In this case, in order to write information, UV light having wavelengths shorter than about 230 nm is finely focused to a size of about 2 µm by a lens. The UV light is emitted by a deuterium discharge lamp, for example. Memory regions $A_{11}, A_{12}, A_{13}, A_{14}, \ldots, A_{1n}$ which are spaced 3 µm from each other are illuminated with the focused UV beam in such a way that the amount of light is adjusted so as to indicate the information to be written, by a shutter and a light attenuator. Similarly, regions $A_{21}, A_{22}, A_{23}, A_{24}, \ldots, A_{2n}$ are illuminated.

In order to read out the information written in this way, light having wavelengths longer than about 230 nm is used as reading light. This light is focused to a size of the order of 2 µm and scans the device regions $A_{11}, A_{12}, A_{13}, A_{14}, \ldots, A_{1n}$ which have information already stored therein. In synchronism with the scan, the peak value of the photocurrent induced in the device regions and in response to illumination of the laser radiation is measured by the current amplifier 72. The information written into the memory regions with UV light can be detected from the peak value of the photocurrent. The reading light can be produced from a He—Ne laser having a wavelength of 633 nm or from a semiconductor laser emitting visible laser light, the semiconductor laser being used in a compact disk player or the like. Of course, laser light in the infrared region can be used.

Figure 8B:
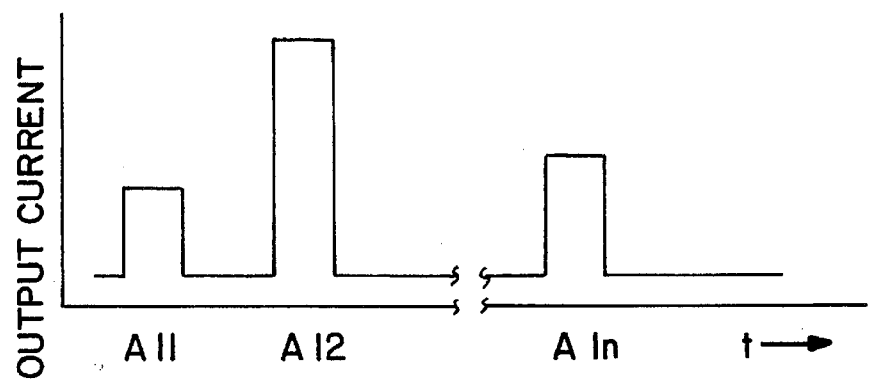
FIG. 8(b) is a diagram showing the output waveform from the electronic device shown in FIG. 8(a)

The information read out in this way takes the form of a signal as shown in FIG. 8(b). It is important that information proportional to the amount of the writing UV light is written into each device region 71 and so it is not only possible to know whether UV light has been emitted but also each piece of information weighted differently can be stored in each device region, as shown in FIG. 8(b).

As can be seen from FIG. 6, information proportional to the amount of the writing UV light impinging on the thin diamond film can be delivered, and can be expressed correctly in terms of at least two figures. Therefore, information of 8 bits, i.e., capable of taking 256 different states, can be written into each one device region 71 on the diamond film. Furthermore, information having continuous value, or an analog signal, corresponding to the amount of the irradiating UV light can be treated.

Figure 7:
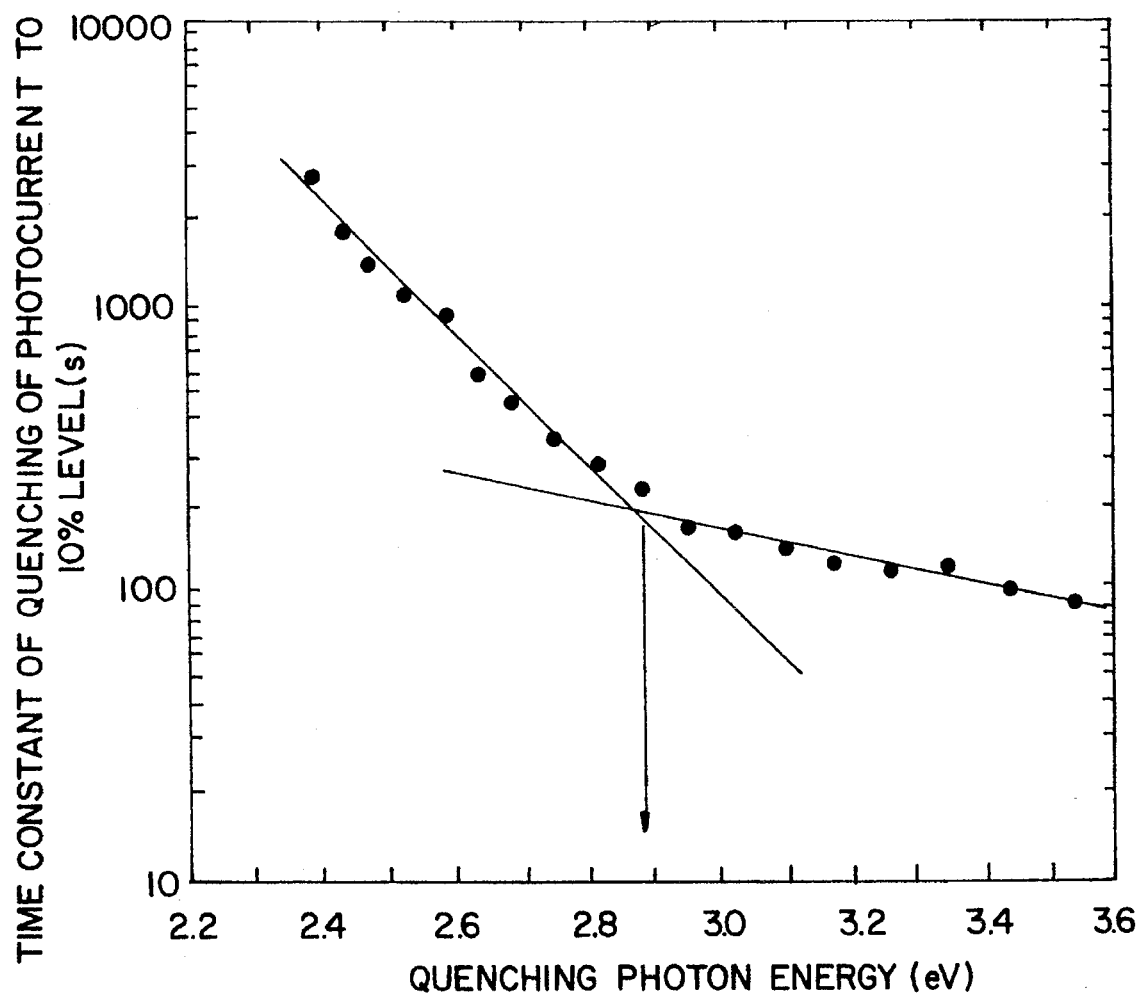
FIG. 7 is a diagram showing the relation of the time taken for photocurrent to decrease to 10% of the peak level to energies corresponding to the wavelengths of light impinging on the ultraviolet detector shown in FIGS. 2(a) and 2(b) after the detector is irradiated with ultraviolet radiation.

For example, in the configuration shown in FIG. 8(a), each electrode is 1 µm wide, and each device region 71 formed on the thin diamond film 70 is 3 µm square. If only binary information indicating ON or OFF state is stored in each device region, then only about 62k bytes of information can be stored in an area 1 mm square. If about 8 bits of information are stored in each device region, then 0.5M bytes of information can be stored in the same area. Hence, 50M bytes of information can be stored in an area of 1 cm$^2$.

Where He—Ne laser light is used as reading light, a rough calculation from FIG. 7 shows that thousands of reading operations can be performed, since the wavelength of 633 nm of He—Ne laser corresponds to about 2 eV. If it is desired to erase information stored in the memory, all the information can be erased by irradiating the whole memory with white light. Of course, information in the memory can be partially erased by selectively illuminating the memory with white light.

In the present example, the wavelength of the writing light does not change during writing and so information stored in the diamond material is only associated with the amount of the writing light.

The information about the amount of the writing light written into the diamond material by the writing light can be overwritten by repeating the irradiation of the writing light. As an example, information corresponding to one unit of light amount is first written into one device region. Then, information corresponding to two units of information is written. More specifically, the material is irradiated with the writing light having an amount of light of 10 $\mu Ws/cm^2$. Subsequently, the device region is irradiated with the writing light having an amount of light of 20 $\mu Ws/cm^2$. It follows that three units of information, i.e., information corresponding to 30 $\mu Ws/cm^2$, has been written into the device region.

In the present example, the laser light for writing and reading is moved relative to the thin diamond film. Obviously, the movement of the laser light can be a relative movement. In addition, the front and rear surfaces of the thin diamond film can be illuminated with the writing light and the reading light, respectively.

In the above examples, the thin diamond film is fabricated by microwave CVD in the presence of a magnetic field. Other CVD method may also be used to fabricate a thin diamond film. Furthermore, other synthetic diamond fabricated by a method other than CVD may be employed. In addition, a natural diamond can be used. Moreover, the shape and the thickness of the thin diamond film may be selected according to the manner in which the invention is practiced. Further, a diamond doped with an impurity to impart one conductivity type can be used.

EXAMPLE 5

Figure 9:
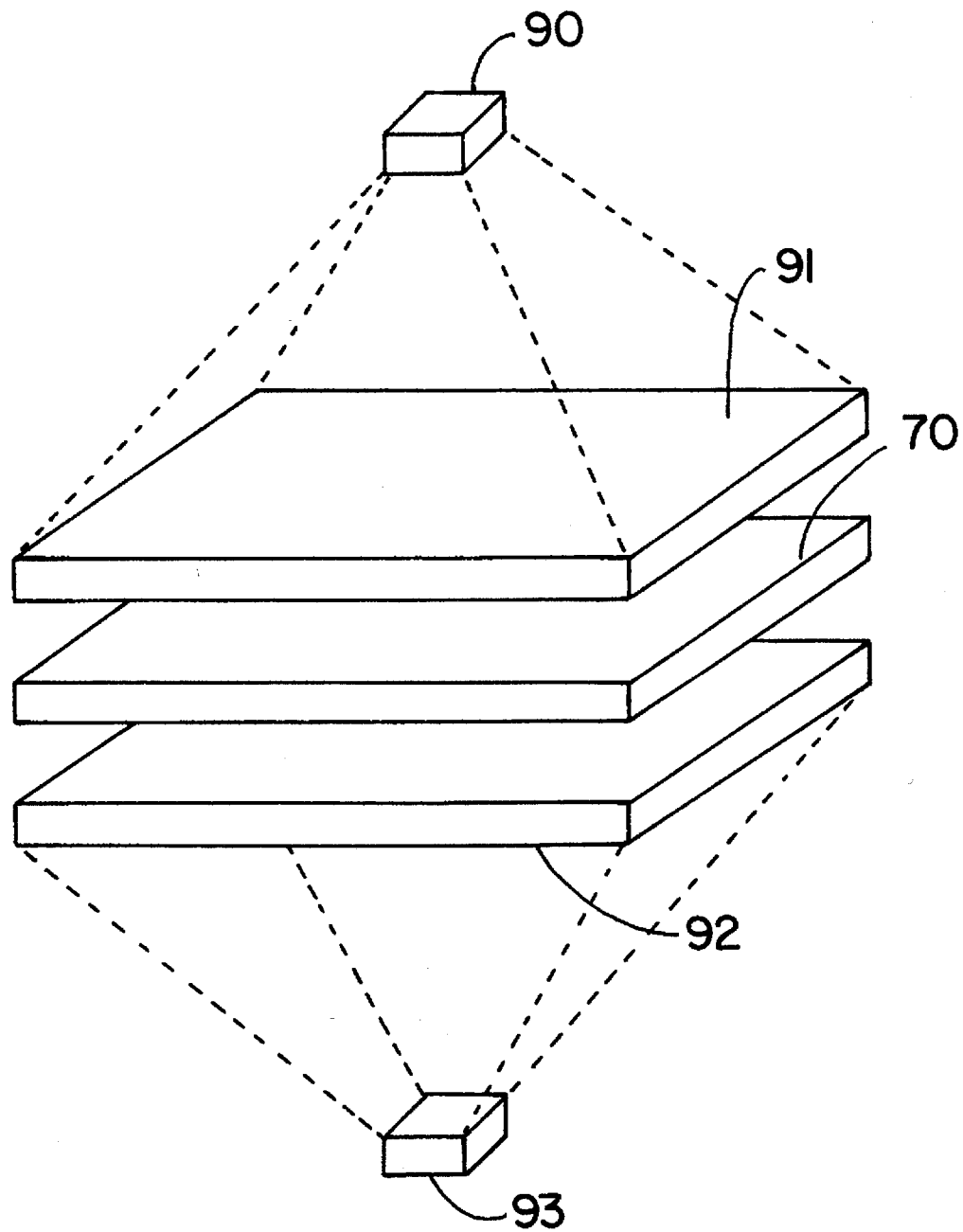
FIG. 9 is a perspective view of another electronic apparatus according to the invention.

The present example relates to an electronic apparatus which is different in structure from the electronic apparatus of Example 4 shown in FIG. 8(*a*). The system of the present example is schematically shown in FIG. 9, where a thin diamond film 70 has the same structure as the structure of the diamond film 70 shown in FIG. 8(*a*). In particular, a structure similar to the electronic apparatus shown in FIG. 8(*a*) is formed on the surface of the thin diamond film. The top surface of the diamond film 70 is similar in structure to the top surface shown in FIG. 8(*a*) although it is not shown in FIG. 9. A peripheral circuit similar to the peripheral circuit shown in FIG. 8(*a*) is provided. Therefore, this electronic apparatus operates essentially in the same way as the electronic apparatus of Example 4 unless stated otherwise.

An optical system 91 guides UV light emitted by a deuterium discharge lamp 90 acting as a first light source selectively to device regions to irradiate the diamond film with the first light, or writing light. This optical system 91 is equipped with optical shutters mounted, corresponding to the device regions. The times for which the shutters are opened and closed can be controlled according to the amount of the first light.

The first light can be directed to the device regions via optical fibers or other light guide means. Furthermore, a first light guide means may be provided for each device region.

A second optical system 92 guides the reading light to the device regions. In particular, light having a single wavelength and emitted from a visible light source 93 is selectively transmitted through optical shutters mounted, corresponding to the device regions so that the visible light from the light source 93 may fall on the device regions of the thin diamond film 70 with a required amount of light. Additionally, a second light guide means may be provided for each device region.

The first light hits the thin diamond film 70 from above as viewed in the figure. The second light hits the film from below as viewed in the figure. Since the rigidity of the diamond film 70 itself is low, a baseplate or substrate (not shown) made of a transparent material transmitting the second light is placed on the diamond film. That is, the second light from the light source 93 is transmitted through the optical system 92 and then through the transparent substrate. Finally, the second light impinges on the device regions of the diamond film 70.

Where the structure of the present example is adopted, a plurality of device regions can be illuminated with light simultaneously. Hence, a high-speed operation can be expected. It is not necessary to emit light while moving the optical system relative to the device regions, unlike in Example 4. Consequently, the device regions can be irradiated with the first and second light at short intervals of time. Again, a high-speed operation can be expected. Information stored can be erased by positioning a white light source in the light source 90 or 93.

EXAMPLE 6

The present example relates to a method of operating the electronic apparatus of Example 4 or 5. The fundamental structure and the method of writing and reading information are similar to those described in Example 4 unless otherwise stated.

As a reading operation is repeated, the resulting photocurrent decreases. This makes it impossible to accurately read the amount of the writing light, or the first light. The present example is intended to solve this problem.

Conceivable means for solving the above-described problem are as follows:

(1) Reading light, or the second light, having a longer wavelength is used. The amount of the light is reduced. For this purpose, pulsed weak light having a long wavelength is employed.

(2) The amount of the writing light is calculated, taking account of a decrease in the photocurrent caused by irradiation of the reading light.

(3) The bias voltage is controlled, taking account of a decrease in the photocurrent caused by irradiation of the reading light.

Even if the configuration (1) above is adopted, the photocurrent decreases with the tendency shown in FIG. 7. In FIG. 7, the number of reading operations is plotted on the horizontal axis, while the photocurrent produced during reading is plotted on the vertical axis.

However, if the wavelength and the amount of the writing light, the wavelength and the amount of the reading light, and the manner in which the photocurrent is measured during reading have been previously determined, then the relation between the number of reading operations and the rate at which the photocurrent decreases during reading can be known in advance. Therefore, in the configuration (2) above, this relation is utilized when plural reading operations are performed. The amount of the writing light is corrected and found.

Nonetheless, as the reading operation is repeated, the stored information will be erased finally. This fundamental problem also takes place where the configuration (3) above is adopted. The present example is constructed in the manner below to solve the above-described problem. When one or more reading operations are performed, an amount of the writing light corresponding to the total decrease (i.e., an integrated value) in the photocurrent is written after the reading so that a constant photocurrent is induced during every reading operation.

As shown in FIG. 3, information stored in the memory region is erased by being read out. We understand that decreases in the number of carriers trapped in the trap levels in the material result in the erasure of the information.

As shown in FIG. 8(b), a signal indicative of information read out corresponds to the amount of the writing light. In the case of FIG. 8(b), $A_{11}$ corresponds to an amount of light 10 $\mu Ws/cm^2$ of the writing light. $A_{12}$ corresponds to an amount of light 25 $\mu Ws/cm^2$ of the writing light. $A_{1n}$ corresponds to an amount of light 12 $\mu Ws/cm^2$ of the writing light.

If the device regions are scanned with the reading light while changing the amount of light from $A_{11}$ to $A_{1n}$ to read information stored in each device region, and if the next scan is made similarly while changing the amount of light from $A_{11}$ to $A_{1n}$, then the peak value of the output voltage or a value obtained by integrating the output value for a given time decreases slightly compared with the previous value. Accordingly, whenever a reading operation is effected, the device regions are irradiated with the writing light having an amount of light corresponding to the decrease in the output current. In consequence, the output is maintained constant irrespective of the number of the reading operations. In this case, of course, it is necessary to previously examine the decrease in the photocurrent or the decrease in the output from the apparatus during reading.

We consider that the amount of decrease in information (corresponding to the photocurrent) caused by one or more reading operations differs according to the amount of the stored information. Consequently, each value is required to be examined in advance. Specific examples of the operation are given below.

Figure 10:
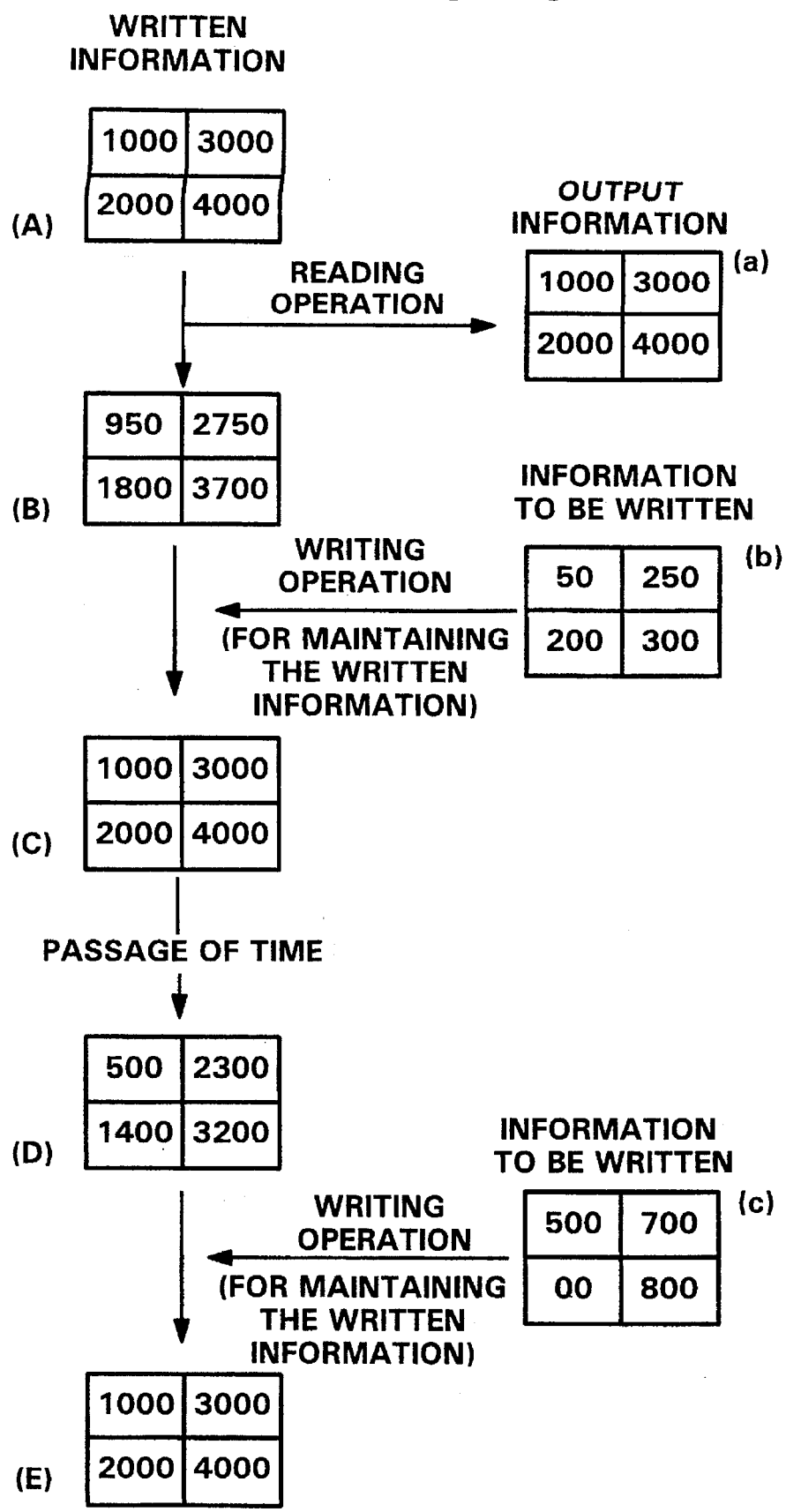
FIG. 10 is a diagram illustrating examples of arithmetic operation performed by electronic device according to the invention.

FIG. 10 shows a simple example of the operation. The apparatus of Example 4 or 5 has device regions arranged in 2 rows and 2 columns.

In state (A) of FIG. 10, the device region $A_{11}$ is irradiated with the first light having an amount of light 1000 $\mu Ws/cm^2$ to write information corresponding to the amount of light 1000 $\mu Ws/cm^2$ of the first light into this device region. Similarly, information corresponding to an amount of light 3000 $\mu Ws/cm^2$ is written into the device region $A_{12}$. Information corresponding to an amount of light 2000 $\mu Ws/cm^2$ is written into the device region $A_{21}$. Information corresponding to an amount of light 4000 $\mu Ws/cm^2$ is written into the device region $A_{22}$. In this way, these pieces of information are stored in the device regions.

It is assumed that the state (A) is the initial state. Under this condition, the device regions are illuminated with the second light to read information. Output values corresponding to values indicated in matrix (a) are calculated from the values of the photocurrent induced in the device regions.

It is then assumed that some information has been lost from the device regions as a result of the above-described reading operations. The amount of the lost information varies, depending on the amount of retained information, the wavelength of the second light, and the amount of the second light, and other factors. In the present example, as shown in (B), the following assumptions are made: Information corresponding to an amount of light 50 $\mu Ws/cm^2$ of the first light has been lost from the device region $A_{11}$. Information corresponding to an amount of light 250 $\mu Ws/cm^2$ of the first light has been lost from the device region $A_{12}$. Information corresponding to an amount of light 200 $\mu Ws/cm^2$ of the first light has been lost from the device region $A_{21}$. Information corresponding to an amount of light 300 $\mu Ws/cm^2$ of the first light has been lost from the device region $A_{22}$.

We now consider a situation in which matrix information (b) is written. In particular, the device region $A_{11}$ is irradiated with the first light having an amount of light 50 $\mu Ws/cm^2$. The device region $A_{12}$ is irradiated with the first light having an amount of light 250 $\mu Ws/cm^2$. The device region $A_{21}$ is irradiated with the first light having an amount of light 200 $\mu Ws/cm^2$. The device region $A_{22}$ is irradiated with the first light having an amount of light 300 $\mu Ws/cm^2$.

At this time, amounts of light accumulatively stored in the device regions are indicated by (C). That is, matrix information lost by reading can be recovered after writing the information after the reading.

The state (C) is allowed to stand. With a lapse of time, information retained in the device regions decreases spontaneously. As a result, state (D) is obtained. The process going from state (B) to state (C) is also performed. In this case, the device regions are irradiated with the first light with amounts of light (indicated by (C)) corresponding to the amounts of information lost with a lapse of time. As a result, as shown in (E), the decreased information can be compensated for. This series of operations is a fundamental operation for retaining information corresponding to the accumulated amount of the first light which impinged on the device regions.

The present example is so constructed that the number of carriers captured in the trap levels in the device regions is maintained constant unless new information is written into these regions. In this way, the apparent amount of information regarding amounts of the writing light stored in the device regions does not decrease irrespective of the number of reading operations.

In the structure of the present example, carriers released from the trap levels in the device regions are compensated for during reading, the carriers forming a photocurrent induced by illumination of the reading light. Therefore, the writing light having a given amount of light must be written into the device regions, which forms a cumbersome operation. However, the output remains constant through plural reading operations.

In the present example, the writing light, or the first light, for writing information into the device regions is used to compensate for the information (in this case, information carried by the photocurrent induced by illumination of the reading light) lost during reading. It is also possible to provide a third illumination means for illuminating the device regions with third light different from the writing light and having an energy greater than the energy bandgap of the material forming the device regions. It is necessary that the third light satisfy the conditions for the first light. This third illumination means is separate from the means for illuminating the writing means. This third light may be used to maintain the number of carriers trapped in the trap levels in the device regions.

EXAMPLE 7

The present example is an extension of the theory described in Example 6 and performs arithmetic operations such as additions and subtractions on information on the device regions described above. In the present example, pulsed writing light and pulsed reading light are used. Information written into the memory regions by irradiating them with one unit of writing light can be made the same as the amount of information read out and reduced by irradiation of one unit of reading light.

Specifically, the total amount of decrease of the photocurrent caused by one reading operation, i.e., one unit of reading, is obtained by integrating the photocurrent I for a given time, the total amount being given by $\int Idt$. This total amount of decrease is made coincident with the total amount of photocurrent increased by one writing operation, or one unit of writing operation. One unit of information is written by one writing operation. One unit of information is taken out by one reading operation. In this way, arithmetic operations such as additions and subtractions can be performed on the memory regions.

When viewed differently, an addition can be performed by illumination of the first light and a subtraction can be performed by illumination of the second light by making the amount of information increased by one unit of writing equal to the amount of information erased by illumination of one unit of light amount of the reading light.

When viewed further differently, carriers trapped in the trap levels in the device regions by illumination of one unit of writing light are excited and released by illumination of one pulse of reading light.

For example, it is assumed that 10 units of information are stored in one device region. If one unit of information is written into the device region and a reading operation is subsequently performed, then information corresponding to 11 units can be read out. At the same time, the amount of information stored in the device region is reduced to 10 units.

Depending on the amount of information held in the device regions, the amount of the first light necessary to write one unit of information and the amount of the second light required to take out one unit of information may differ. In this case, it is necessary to determine the amount of the first light and the amount of the second light which correspond to the retained information.

The unit of information treated by one device region can be roughly calculated, for example, from the data shown in FIG. 6 where a thin polycrystalline diamond film is used, though the unit may be affected by the manner in which information is divided into units. The vertical axis of FIG. 6 shows that the amount of the first light can be read out by illumination of the second light and expressed by means of approximately two digits. The data shown in FIG. 6 indicates that 256 units, or 8 bits, of information can be, in principle, treated by the device region.

EXAMPLE 8

In the present example, the apparatus of Example 4 or 5 is used as an arithmetic unit. For the sake of simplicity, it is assumed that device regions $A_{mn}$ are arranged in 2 rows and 2 columns, thus forming a matrix. In the same way as in Example 4 or 5, device regions $A_{11}$, $A_{12}$, $A_{21}$, and $A_{22}$ are formed.

When the amount of the first light is 1000 $\mu Ws/cm^2$, one unit of information is treated. When the amount of the first light is 2000 $\mu Ws/cm^2$, two units of information are treated. When the amount of the first light is 3000 $\mu Ws/cm^2$ three units of information are treated. When the amount of the first light is 4000 $\mu Ws/cm^2$, four units of information are treated. Including the state in which no illumination is performed, information from 0 to 4 units is treated. Of course, more units of information can be established.

Figure 11:
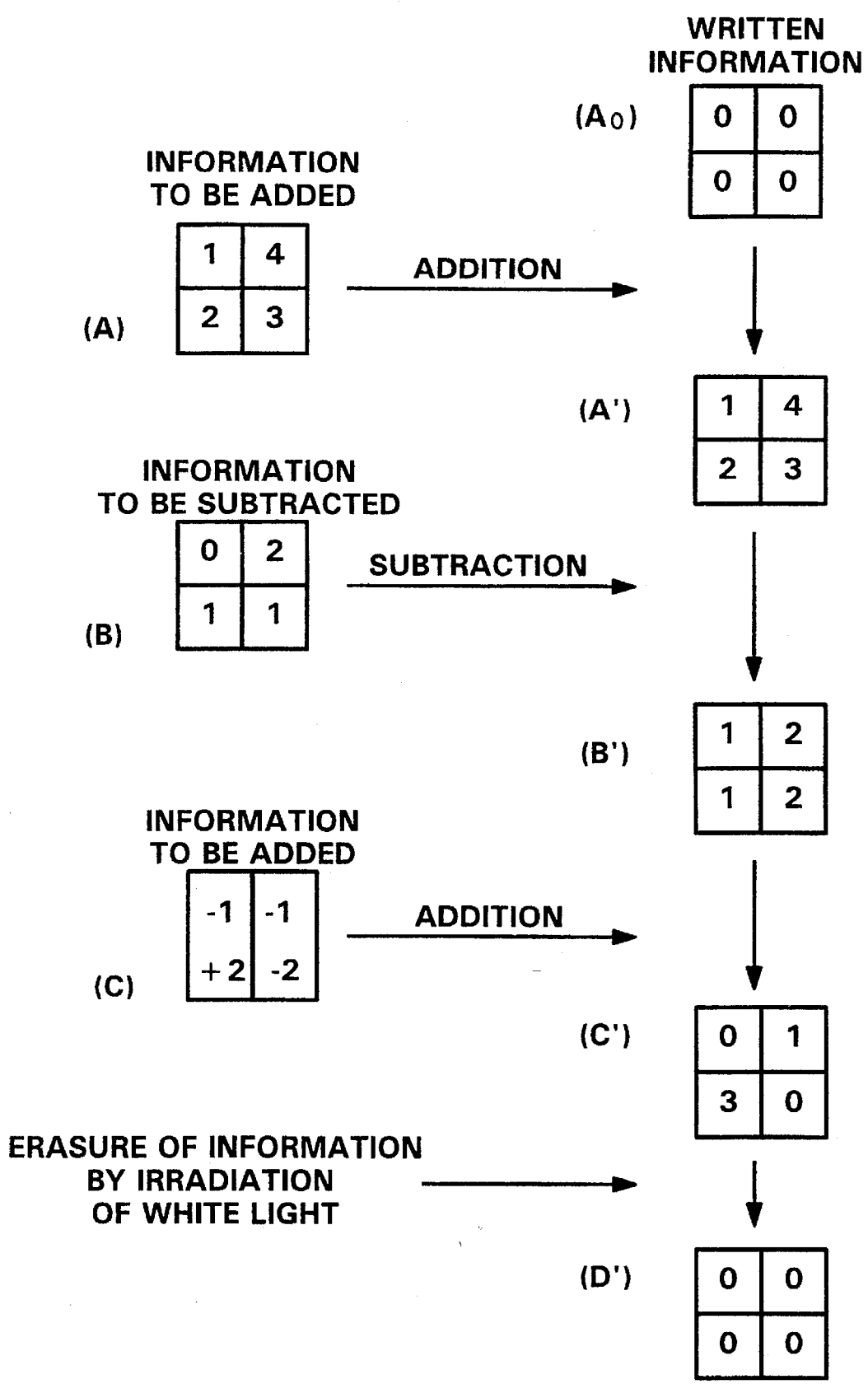
FIG. 11 is a diagram illustrating examples of arithmetic operation performed by electronic device according to the invention.

FIG. 11 shows an example of arithmetic operation according to the present example. In state $(A_0)$, the following relations hold: $A_{11}=0$, $A_{12}=0$, $A_{21}=0$, and $A_{22}=0$. That is, information is stored in none of the device regions. To realize this state, the device regions are illuminated with white light or with light having a wavelength corresponding to the second light to erase the stored information.

In the state $(A_0)$ described above, the matrix information indicated by (A) is added to the state $(A_0)$. This addition can be regarded as writing of information. This addition can be carried out by writing one unit of information into the device region $A_{11}$, 4 units of information into the device region $A_{12}$, 2 units of information into the device region $A_{21}$, and 3 units of information into the device region $A_{22}$. The writing is done by irradiating the device regions with the first light having the corresponding amounts of light.

By adding information indicated by (A), information retained in the device regions takes the form indicated by (A'). At this time, information retained in the device region is the sum of the matrix information indicated by $(A_0)$ and the matrix information indicated by (A). That is, a matrix calculation $(A')=(A_0)+(A)$ holds.

We now discuss the situation in which information indicated by (B) is subtracted from information indicated by (A') to erase or take out the former information. For this subtraction, the device regions are irradiated with the second light so as to erase the corresponding information. At this time, the amount and the wavelength of the second light must be determined, taking account of the relation of the actually retained information to the erased information. That is, it is necessary to previously know how much information is lost by illumination of what amount of the second light.

A method of subtracting the information indicated by (B) from the information indicated by (A') is now described. For this operation, investigations are previously made to know what amount of the second light is necessary to erase 2 units of information from the device region $A_{12}$ storing 4 units of information, to know what amount of the second light is necessary to erase 1 unit of information from the device region $A_{21}$ storing 2 units of information, and to know what amount of the second light is needed to erase 1 unit of information from the device region $A_{22}$ storing three units of information. Then, the device regions are irradiated with the second light with the corresponding amounts of light.

As a result of the above-described arithmetic operations, information indicated by (B') is stored in the device regions. We now discuss an addition of information indicated by (C). In the arithmetic operations described thus far, additions are performed independent of subtractions. The information indicated by (C) is information about matrix $A_{mn}$ and contains both positive and negative elements. In the corresponding device regions, additions of negative elements, i.e., subtractions, are performed.

In this case, when a positive element is added, the corresponding device element is irradiated with the first light with a corresponding amount of light. When a negative element is added, the corresponding device element is irradiated with the second light with a corresponding amount of light.

As a result of the arithmetic operations, elements of the matrix indicated by (C') are stored in the device regions. The device regions are then illuminated with white light to thereby erase information stored in the device regions. This state is indicated by $A_{mn}=0$ and shown as (D').

In the above-described arithmetic operations, an operation for reading information from the device regions is not described. However, in any desired state, the device regions can be irradiated with the second light to read information from them. Obviously, the operation for compensating for the lost information can be carried out at this time.

The arithmetic operations described thus far are effected where device regions are arranged in 2 rows and 2 columns. Where each one device region including conductive interconnects and electrodes is 5 μm square and the thin polycrystalline diamond film on which the device regions are formed is 10 cm square, a matrix consisting of $(2 \times 10^4) \times (2 \times 10^4)$ can be formed. A rough calculation made based on the data shown in FIG. 6 shows that more than 100 different states of information can be treated by each one device region.

The configuration described above can be regarded as an arithmetic unit made up of $(2 \times 10^4) \times (2 \times 10^4)$ device regions each of which is capable of accumulating and storing input information. In addition, each device region can be regarded as an arithmetic element capable of accumulatively storing input information and of reading and writing of information, or additions and subtractions. Utilizing this configuration, matrix calculations, arithmetic operations using multivalued logic, non-von Neumann-type computations, and neuro computations can be performed.

EXAMPLE 9

The present example uses the electronic apparatus of Example 4 or 5 and performs arithmetic operations to treat information about a three-dimensional image. Examples of arithmetic operations are hereinafter described by referring to FIG. 12, where a three-dimensional figure is depicted in a three-dimensional space indicated by an xyz three-dimensional Cartesian coordinate system. A cube is shown in (A). To mathematically express this cube, the coordinates of the vertices of this cube should be given. In this case, it is necessary to indicate the x-, y-, and z-coordinates.

The apparatus of Example 4 or 5 is equipped with the device regions arranged so as to form the matrix $A_{mn}$. Each device region can treat weighted pieces of information. As an example, the range of the amount of light of the first light from 1000 to 1000 μWs/cm$^2$ is divided into several portions at intervals of 1000 μWs/cm$^2$. Then, 1000 μWs/cm$^2$, 2000 μWs/cm$^2$, and 3000 μWs/cm$^2$ are taken as 1 unit, 2 units, and 3 units, respectively. These are treated as pieces of information which can be accumulated.

It is assumed that each weight indicates one coordinate, in this case a z-coordinate. In the above example, 1 unit, 2 units, 3 units, and so on are weights. It is also assumed that the elements of the matrix $A_{mn}$ indicate x- and y-coordinates. That is, the subscripts m and n correspond to x and y, respectively.

More specifically, x- and y-components are expressed by coordinates which indicate positions assigned to the device regions, respectively. Z-components are weighted information stored in the device regions. Since these three kinds of information are independent of each other, a three-dimensional Cartesian coordinate system can be constituted. For example, in order to specify the coordinates of (x, y, z)=(1, 1, 1), the device region $A_{11}$ is irradiated with the first light with amount of light 1000 μWs/cm$^2$ to store 1 unit of information in the device region $A_{11}$.

Figure 12A:
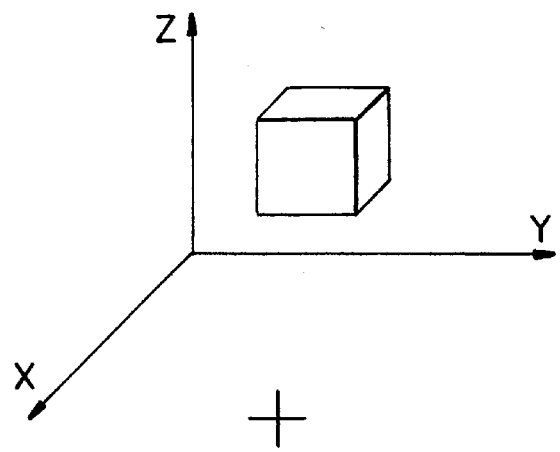
FIGS. 12(A) to 12(C) are diagrams illustrating examples of arithmetic operations performed by electronic device according to the invention.
Figure 12B:
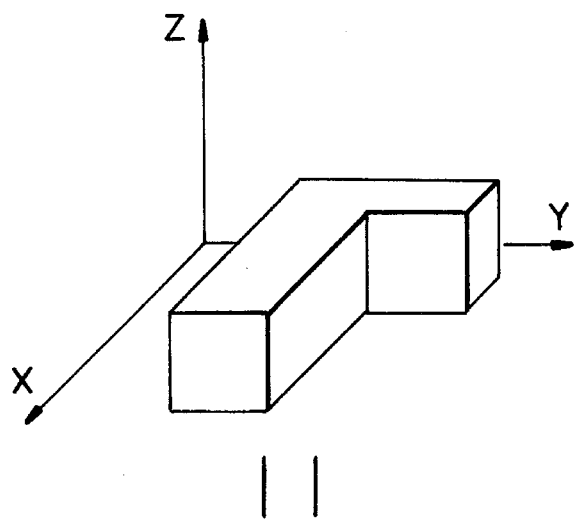

The figures shown in FIG. 12 are discussed now. As is well known in the art, figures shown in FIG. 12, (A)–(C), can be mathematically represented in terms of three-dimensional Cartesian coordinates. Therefore, these figures can be expressed in terms of the values of the matrix $A_{mn}$ on the coordinate axes, respectively, and in terms of numerical values corresponding to weighted pieces of information stored in the device regions.

Figure 12C:
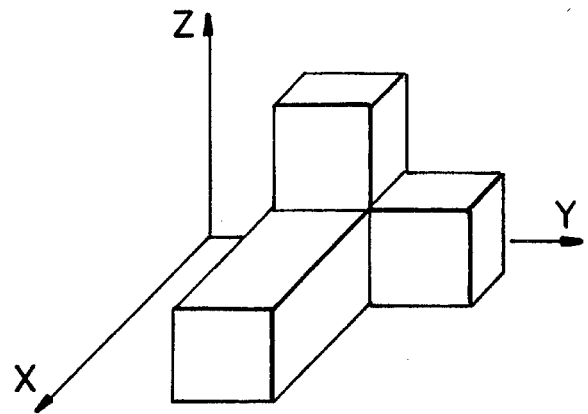

FIG. 12 shows that sum of the figures (A) and (B) produces the figure (C). We can understand that this is an arithmetic operation for carrying out summation of three-dimensional figures. Visually, the result of the arithmetic operation shown in FIG. 12(C) can be expressed in terms of the coordinates indicating the three-dimensional figures. In this case, values on x- and y-axes are given by the coordinates of the positions of the device regions, or the coordinates hit by the first light, i.e., the writing light, or the second light, i.e., the reading light.

The values of the x- and y-components in FIG. 12 can be selected, depending on whether the device regions are irradiated with the first light or with the second light. The z-components in FIG. 12 can be expressed in terms of values corresponding to information stored in the device regions.

Where information about the three-dimensional figures as shown in FIG. 12 is subjected to arithmetic operations for summing up three-dimensional figures as shown in FIG. 12, the arithmetic operations are performed in practice as follows. The first light is selected as light impinging on the device regions of the apparatus shown in FIGS. 8 or 9 to determine the values of x- or y-components. The amount of the first light falling on the device regions is selected, whereby the values of z-components are determined.

As can be seen from FIG. 12, if the three-dimensional figure (B) is subtracted from the three-dimensional figure (C), then the three-dimensional figure (A) can be obtained. If the three-dimensional figure (A) is subtracted from the three-dimensional figure (C), then the three-dimensional figure (B) can be derived. As described previously, an addition of information can be performed by illumination of the first light. A subtraction can be performed by illumination of the second light. Hence, the sum of three-dimensional figures can be performed. Moreover, the difference between three-dimensional figures can be calculated.

When an arithmetic operation is carried out in practice, the positions on the device regions $A_{mn}$ hit by the first light and the second light, respectively, and the amounts of these two kinds of light are determined according to a calculational procedure. The two kinds of light are successively emitted in a sequence determined by the calculational procedure. In this way, the arithmetic operation is performed.

In the arithmetic operation described above, simple three-dimensional figures as shown in FIG. 12 are used. The same concept can be applied to calculations of more complex three-dimensional figures. Arithmetic operations in the present example is characterized in that a calculation of complex information can be performed merely by emitting the two kinds of light in a given sequence.

As described above, where the configuration of the present example is adopted, different pieces of information about three-dimensional figures can be subjected to an arithmetic operation. This operation can be carried out by summation or subtraction of three-dimensional figures. The arithmetic operation can be effected simply by emitting the two kinds of light successively in a given sequence.

EXAMPLE 10

The present example is similar to the structure of Example 4 or 5 except that a thin film of silicon carbide (SIC) is used instead of the thin diamond film 70. The energy bandgap of silicon carbide is approximately 2 to 3 eV. Assuming that the energy bandgap is 3 eV, the corresponding wavelength is about 413 nm. This makes it possible to use as the first light such light emitted from a mercury lamp or KrF excimer laser which has a wavelength of 248 nm. Furthermore, He—Ne laser light having a wavelength of 633 nm or visible semiconductor laser radiation can be used as the second light source. The method of operation is the same as the method used in Examples 4 and 5.

EXAMPLE 11

The present example relates to a disklike apparatus which is schematically shown in FIG. 13. This apparatus shown in FIG. 13 is obtained by shaping the structure shown in FIG. 8($a$) into a disklike form. Information is written and read to and from desired memory regions on the apparatus by rotating the disk. Also, information can be entered into and taken out from the apparatus. The present example can be operated in the same manner as other examples already described. In particular, structures described in other examples can be combined with the present example or used in the present example.

The present example is characterized in that writing light is directed to one side of the disk. Reading light is directed to the other side of the disk. Information is written and read at a high speed by rotating the disk. In addition, arithmetic operations are performed.

In the present example, the following relations hold essentially:

$$E_2 < E_g < E_1$$

where $E_g$ is the energy bandgap of the material forming the memory regions or device regions, $E_1$ is the photon energy corresponding to the wavelength of the writing light, and $E_2$ is the photon energy corresponding to the wavelength of the reading light.

The apparatus shown in FIG. 13 is described now. FIG. 13 is a cross-sectional view of the apparatus. This apparatus comprises a disk 98 consisting of a pair of transparent electrodes 106 and 107 and a thin diamond film 105 sandwiched between the electrodes 106 and 107. The diamond film 105 is provided with a multiplicity of device regions. The electrodes 106 and 107 rotate about an axis of rotation 94. Writing light 100 is directed from a writing light source 95 toward the disk 98. The writing light source 95 comprises a deuterium discharge lamp emitting light having wavelengths of 180 to 950 nm, a shutter for blocking the light, a light amount-adjusting means, and other optics. The writing light source 95 can be moved right and left as indicated by the arrows 103. This horizontal movement of the writing light source 95 cooperates with the rotation of the disk 98 to permit the whole disk surface to be scanned.

A reading light source 96 emits reading light 99, and is composed of a visible light semiconductor laser emitting light having wavelengths from 770 to 840 nm, a shutter for blocking the light, a light amount-adjusting means, and other optics. This reading light source 96 moves right and left as indicated by the arrows 104. This horizontal movement of the reading light source 96 is combined with rotation of the disk 98 to scan the whole surface of the disk.

As the thin diamond film 105 is irradiated with the reading light 99, a photocurrent is induced in the film. This photocurrent is measured by a reading portion 97 comprising electrical contact portions 101 and 102 which are electrically connected with the transparent electrodes 106 and 107, respectively. The reading portion 97 comprises a bias voltage source for applying a voltage between the electrodes 106 and 107, an apparatus for measuring the electrical current flowing between the electrodes 106 and 107, and other requisite apparatus such as an amplifier, an arithmetic unit, and memories.

It is necessary that the writing light 100 be transmitted through the transparent electrode 106 and arrive at the diamond film 105. Also, it is necessary that the reading light 99 be transmitted through the transparent electrode 107 and arrive at the diamond film 105. In the present example, the transparent electrode 106 is made of a copper plate which transmits wavelengths shorter than about 230 nm (roughly corresponding to the energy bandgap of the diamond film 91) that is necessary as the writing light. The transparent electrode 107 consists of a well-known film of $SnO_2$ transmitting visible light. The copper filter forming the transparent electrode 106 acts as one kind of optical filter.

The writing light 100 is directed to the diamond film 105 through the transparent electrode 106. Information about the amount of the writing light impinging on the film is written into the device regions. The reading light 99 is directed to the diamond film 105 through the transparent electrode 107. In order to read information, the device regions are illuminated with the reading light to thereby induce a photocurrent between the electrodes 106 and 107. This photocurrent is measured by the reading portion 97, and then predetermined calculations are performed. This operation is carried out at a high speed by rotating the disk 98 about the axis of rotation 94 and scanning the writing light source 95 and the reading light source 96 as indicated by the arrows 103 and 104, respectively.

In the present example, it is advantageous, of course, to use pulsed light as the writing light. It is also possible to change the amount of the writing light continuously. The light whose amount is varied continuously is directed to the disk, so that information about the amount of light is written. In this way, even analog signals can be treated.

A large-capacity disk memory can be obtained by utilizing the configuration of the present example. In particular, information is stored in desired device regions on the disk. The information can be read out, using the photocurrent induced by illumination of the reading light. The information can be read out repeatedly.

In the present example, the disk has a diameter of 10 cm and an area of 78.5 cm$^2$. If about 50M bytes of information can be stored in an area of 1 cm$^2$, then about 4000M bytes, or about 4 G bytes, of information can be stored in this disk. By writing and taking out information, an arithmetic device having a storage capacity of about 4 G bytes can be accomplished.

In the present example, the rigidity of the disk 98 can be effectively maintained by reinforcing the transparent electrode 107 with an organic resin or plastic material which transmits the reading light 99.

Also, in the present example, it is advantageous to provide a separate means for emitting light having a wavelength which is independent of the writing light but satisfies the conditions for the writing light to maintain the stored information. In this way, those portions of the information stored in the device regions which are lost by reading or spontaneous annihilation are compensated for. As the result, the information can be retained.

EXAMPLE 12

This embodiment is an example of utilizing a thin film of silicon carbide in place of a diamond thin film, in the structure shown in Embodiment 2 or Embodiment 3. In the case of utilizing a silicon carbide film, if its energy band gap ($E_g$) is situated as, for example, 3 eV, then corresponding wavelength is approximately 413 nm. Therefore, light with wavelength shorter than 413 nm can be situated as a first light (writing light), and light with wavelength longer than 413 nm can be situated as a second light (reading light).

In general, light of 400 nm or less is called as ultraviolet light. Therefore, by utilizing a silicon carbide film with energy band gap of approximately 3 eV (It should not be necessarily a film), dose meter measuring quantity of light of ultraviolet region can be obtained.

In this case, as reading light, light having wavelength of approximately 500 nm or more, for example, light of visible light semiconductor laser can be utilized. If light corresponding to a first light is selectively irradiated to a silicon carbide film, a filter shutting or decreasing light of 400 nm or more can be utilized.

Here, energy band gap of a silicon carbide film is situated as 3 eV. This value can be controlled generally in a range of 2.2 to 3.2 eV, and this value can be selected at random.

EXAMPLE 13

Figure 14:
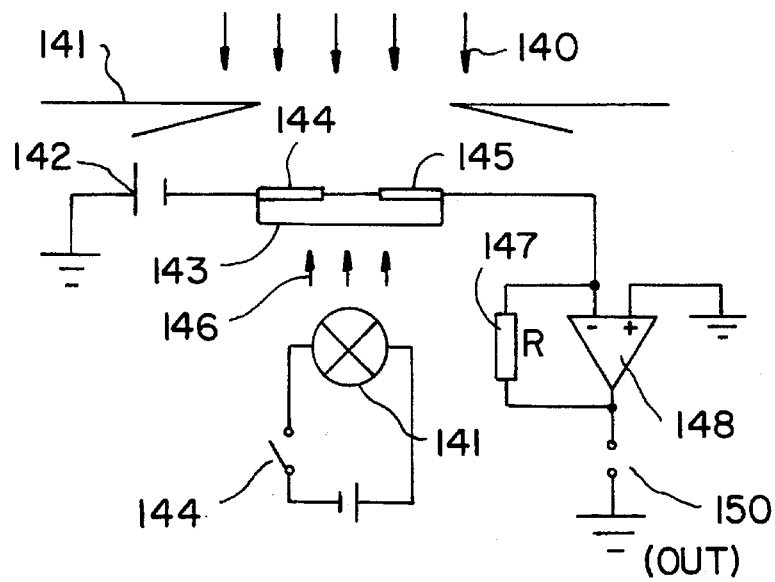
FIG. 14 shows an example of electronic device according to the invention.

This embodiment is a further specific example of the scale of quantity of light shown in Embodiment 2. FIG. 14 shows a summary of it. Ultraviolet light or light including this ultraviolet light of which light quantum energy is approximately 5.5 eV or more (140) is irradiated to a diamond thin film (143) through a shutter (141). This diamond thin film (143) is a poly-crystal diamond thin film of 1 mm×1 mm and thickness of 10 μm which is synthesized in a gas phase by magnetic field microwave plasma CVD method shown in Embodiment 1. Gold electrodes of (144) and (145) of 1μ thickness are formed with a gap of 0.5 mm on the surface of this diamond thin film (143). Voltage of 10 V is applied from a bias electric source (142) to these pair of electrodes (144) and (145).

According to observation, resistivity of the diamond thin film (143) in dark condition (no light is irradiated) is approximately $10^{10}$ Ωcm. Therefore resistance between electrodes (144) and (145) is $10^{13}$ Ω, by calculation formula R=ρl/S. As bias voltage is 10 V, electric current flown between the electrodes (144) and (145) is $10^{-12}$ A(1pA). That is, electric current of 1pA is flown to the diamond thin film (143) in dark condition. This current becomes output current.

In the structure shown in FIG. 14, this output current is amplified by OP Amp (148). Here, if resistance of resistance R (147) is selected as 1 GΩ, V=1 mV is obtained as output at (150), because I=1pA, R=1GΩ in V=IR of ohm's law. As OP Amp (148), C814C of NEC and OP-05 of PMI, etc. can be utilized.

To read quantity of irradiated light indicated as (140) corresponding to a first light, switch (144) should be ON and white light (146) should be irradiated from a halogen lamp (141). This white light (146) from the halogen lamp (141) should satisfy the conditions needed for a second light. It is desirable to close a shutter (141) to prevent effect of light (140), during light irradiation from this halogen lamp (141). Visible light semiconductor laser and the like can be utilized in place of the halogen lamp (141). In the structure shown in FIG. 14, the face irradiated with the first light (141) and the face irradiated with the second light (142) are different. In a structure like this, though it is not made of a material other than thin film diamond, it can be utilized as long as a thin film material is utilized.

Output obtained in (150) is offset output in dark condition. By reading, said output is changed a lot. Needless to say, said output is also changed by irradiating ultraviolet light. By processing output obtained in (150), quantity of ultraviolet light irradiated to the diamond thin film (143) can be known.

As a method of processing output obtained from (150), output is changed to digital signals by A/D converter, and maximum value, or estimated value of this output in a specified time can be known.

An example of utilizing a diamond thin film is shown above. However, a material other than diamond thin film, for example, a silicon carbide film can be also utilized.

EXAMPLE 14

This embodiment is further improvement of Embodiment 13. The structure of this embodiment can be utilized, for example, in the case when quantity of light a human body is irradiated is measured.

Figure 15A:
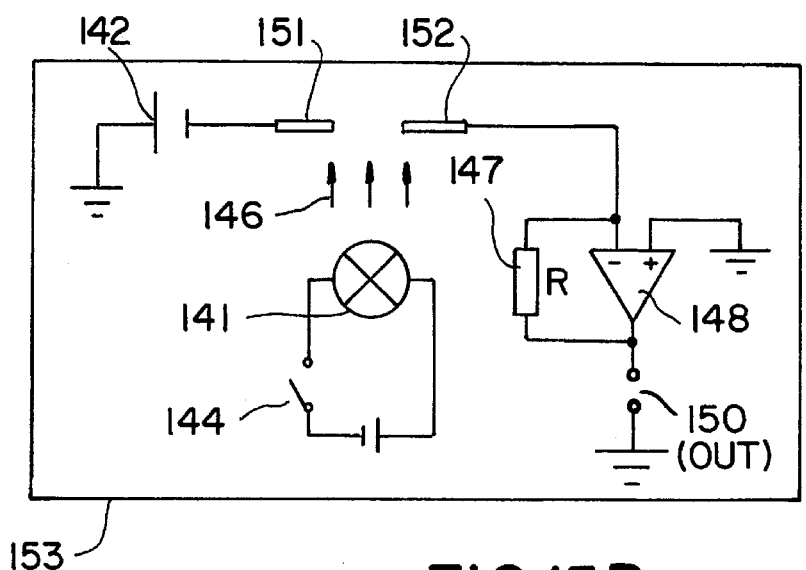
FIGS. 15(A) and 15(B) show an example of electronic device according to the invention.
Figure 15B:
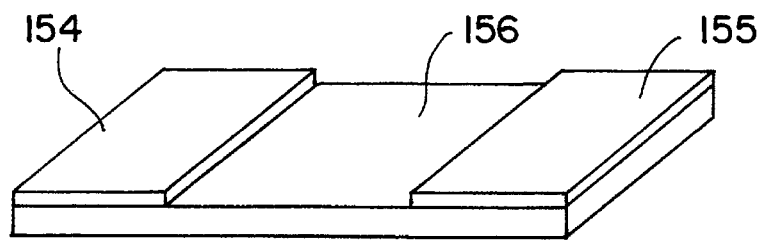

FIG. 15 shows summary of this embodiment. The part the mark same as that of FIG. 14 indicates that explained in Embodiment 13. Constant of each part is the same as that indicated in Embodiment 13, unless it is particularly mentioned.

The apparatus shown in (A) is an apparatus for measuring irradiated quantity of ultraviolet light irradiated to a diamond thin film. The structure shown in (A) is provided in a container (153) intercepting ultraviolet light and visible light, to prevent effect of light irradiated from outside.

(B) shows a part of a sensor having a diamond thin film (156) and a pair of metal electrodes (154) and (155) formed on the surface of it. What can be measured is ultraviolet light of which energy of light quantum is approximately 5.5 eV or more.

As is shown in FIGS. 15 (A) and (B), this embodiment is characterized in that a sensor portion (B) accumulating irradiated quantity of ultraviolet light as information and a device (A) reading the information accumulated in the sensor portion are separated.

In the apparatus shown in (A), a means of irradiating the second light to a material of a thin film (In this case, (156) of (B)), and a means of detecting photoconductive current flown into the thin film material by irradiation of the second light (it means (148)) are provided. Separated from the apparatus shown in (A), as is shown in (B), a sensor portion is constituted with a thin film material forming a pair of electrodes (it means 156)). When information concerning irradiated quantity of a first light written in the thin film material is read, the sensor portion shown as (B) is disposed in the apparatus shown as (A), and information is read. Needless to say, the thin film material is a material having photoconductive effect, energy band gap, and trap level.

For practical use, irradiated quantity of ultraviolet light is accumulated in a diamond thin film (156) by having the part of the sensor indicated as (B) by man, or by providing it to a place measured.

To read irradiated quantity of ultraviolet light from the diamond thin film (156), a portion of sensor (B) is disposed so that an electrode (151) with an electrode (154), an electrode (152) with an electrode (155) are touched with each other. White light (146) is irradiated to a diamond thin film (156) from a halogen lamp (141), and change of photoconductive current flown is taken out from output (150). The output taken out from (150) is processed by digital treatment and the like, and irradiated quantity of light is found. In the structure indicated in (B), the face to be irradiated with ultraviolet light can be either the front side or the back side.

The structure shown in FIG. 15 can be utilized in the conditions as the following. For example, a case when a man should be active in an environment irradiated with ultraviolet light with wavelength of 230 nm or less is considered. In a case like this, it is necessary to know how much ultraviolet a man is exposed to. To act in this environment, a man wears the sensor portion shown as (B), and acts for a prescribed time. After activation is finished, the sensor portion indicated as (B) is disposed in an apparatus shown as (A), outside of said environment. Nextly, white light is irradiated from a halogen lamp (141), and irradiated quantity of ultraviolet light accumulated from the output (150) to the diamond thin film (156) is read. In this way, it is possible to know quantity of ultraviolet light irradiated to a man who acted in the environment irradiated with ultraviolet light with wavelength of approximately 230 nm or less.

Reading in the apparatus indicated as (A) can be performed in a few seconds. It is also possible to read information and to erase information simultaneously.

The structure shown in FIG. 15 can be utilized in a condition as the following. For example, in a manufacturing process of a semiconductor device like LSI, a process utilizing ultraviolet light is known. This is a technology to form minute mask pattern by exposing a resist material to light with wavelength shorter than that of ultraviolet light.

In the case like this, it is possible to utilize a structure shown in FIG. 15 to measure how much light with wavelength shorter than that of ultraviolet light is irradiated in said process. Here, what has to do is to arrange a sensor portion shown as (B) instead of a substrate, and to set it in the process of irradiating light with wavelength shorter than that of ultraviolet light. After the process, by removing the sensor portion shown as (B) and utilizing an apparatus shown as (A), quantity of light with wavelength shorter than that of ultraviolet light irradiated to the diamond thin film can be known. In this way, actual quantity of light with wavelength shorter than that of ultraviolet light can be known.

An example of utilizing ultraviolet light for disinfection of food is known. In this case, too, the structure shown in FIG. 15 can be utilized.

If the structure shown in FIG. 15 is utilized, the sensor portion shown as (B) can be utilized in many numbers to the apparatus shown as (A). Therefore there is an advantage that it can be achieved at a low cost.

For example, a case a plurality of persons wear the sensor portion shown as (B) in a place with danger of being exposed to ultraviolet light with wavelength of 230 nm or less is considered. In this case, quantity of ultraviolet light irradiated to the sensor portion can be known by utilizing the apparatus shown as (A) provided outside. From this amount, it is possible to know amount of irradiated ultraviolet light to which each person is exposed.

In this case, all has to do is to prepare one apparatus shown as (A) per a plurality of persons. Therefore it is advantageous from the standpoint of cost.

The method of utilization as above can be utilized in the case of measuring irradiated light amount of γ rays or X rays. Therefore it can be also utilized for a field of nuclear energy and a field of medicine, furthermore for a field of space technology.

In the explanation above, an example utilizing a diamond thin film (156) is shown. However, it is also possible to utilize a silicon carbon film and an aluminum nitride film as a thin film (156). Especially in the case of utilizing a silicon carbide film, it is possible to measure quantity of irradiated light with wavelength approximately 400 nm or shorter. It is one of the most appropriate method to utilize it as a dose meter of ultraviolet light.

OTHER APPLICATIONS

As described thus far, the fundamental operation of the present invention is that information is written into a material by means of first light, or reading light. The information is read out by a photocurrent induced by illumination of second light, or reading light. Expressed simply, the fundamental operation is that writing is done by light and reading is done by an electrical current. Since this operation is a conversion from a light signal into an electrical signal, the novel apparatus acts as a converter. Generally, memories, switching devices, arithmetic devices, and amplifier devices receive and deliver currents or voltages. A further device is based on the structure shown in FIG. 8(a) and provided with one or more solid-state lasers (e.g., semiconductor lasers) corresponding to each or all of plural memory regions. In the apparatus, information is written and read. Of course, light-emitting devices may be used instead of solid-state lasers and semiconductor lasers.

To accomplish the above structure, it is necessary to provide the writing light source independent of the reading light source. If a single unit capable of emitting two wavelengths is used, the structure can be made simpler. Of course, the wavelengths of the writing light and the reading light, respectively, are determined by the energy bandgap of the used material.

By adopting the structure described above, an electronic apparatus receiving and producing electrical signals can be realized. It is advantageous to form an integrated circuit equipped with arithmetic devices and memories on or in a material according to the invention, making use of this structure. In addition, an electronic apparatus receiving and producing light can be accomplished by converting a photocurrent induced by illumination of reading light into light by a semiconductor laser or light-emitting device. Obviously, the structure described above can be used in the various examples described above.

Various devices such as various transistors and diodes utilizing PN junctions and PIN junctions in which dissimilar semiconductor conductivity types are in contact with each other are generally known. It is advantageous to apply the present invention to these structures. Especially, where the invention is applied to phototransistors and photodiodes, unique operations can be realized. That is, information storage function and novel arithmetic function can be imparted to phototransistors and photodiodes. Hence, a totally novel type of device can be obtained. Also, a structure producing an electromotive force can be fabricated by forming a junction between dissimilar semiconductor conductivity types (e.g., PN junction, PIN junction, or PI junction) in a material according to the invention, irradiating the material with first light so that carriers may be trapped in trap levels, irradiating the material with second light to promote the carriers out of the trap levels, and producing an internal electric field attributed to the junction 200. In this case, information is written into the material by illuminating the material with the first light. An electromotive force can be obtained by illuminating the material with the second light, or reading light. Of course, in a structure having a junction 200 between dissimilar conductivity types, a forward or reverse bias can be applied from the outside.

In the present invention, a material having a certain physical property is illuminated with first light having a wavelength shorter than a certain wavelength determined by the energy bandgap of the material. Then, the material is illuminated with second light having a wavelength shorter than the certain wavelength. The resulting photocurrent is measured. In this way, information about the first light, especially information regarding the amount of the first light impinging on the material, can be obtained. Utilizing this principle, the following advantages can be had.

(1) A totally novel type of light detector can be obtained.

(2) Especially, where diamond is used, ultraviolet radiation can be detected at high sensitivity.

(3) The amount of light can be detected.

(4) An electronic apparatus which receives light and produces a photocurrent can be obtained.

(5) A totally novel type of memory can be obtained.

(6) An arithmetic device can be obtained.

The present invention provides devices treating analog devices, devices treating light signals, switching devices using light signals, neuro devices, optical devices, and so on.

An electronic device according to the invention has the great advantage that it delivers a photocurrent in operation. This output current can be varied by controlling the bias voltage or the gap between the electrodes across which the bias voltage is applied. The ability to control the output offers quite high practicability.

It is known that diamond is used as a material for detecting X-rays and gamma rays. It is possible in principle to fabricate an X-ray detector, a gamma ray detector, an X-ray dosimeter, or a gamma ray dosimeter according to the invention. In this case, by using a diamond or a material having an energy bandgap higher than that of diamond (e.g., in principle, c-BN and AlN can be used), the presence or absence of irradiation of X-rays or gamma rays or the dose can be known.

What is claimed is:

1. An electronic device comprising:

a substance comprising a CVD diamond and having photoconductivity, an energy bandgap and a trap level, and means for reading out information about a first electromagnetic emission irradiated to said substance in accordance with electric resistance of said substance or photocurrent flowing in said substance with a second electromagnetic emission being irradiated to said substance, wherein said first electromagnetic emission has a photon energy greater than an energy bandgap of said substance, and said second electromagnetic emission has a photon energy smaller than said energy bandgap, and wherein said information about said first electromagnetic emission irradiated to said substance relates to different wavelengths of said first electromagnetic emission.

2. The device of claim 1 wherein said means further operates to illuminate said substance with said second electromagnetic emission after said substance is illuminated with said first electromagnetic emission.

3. The device of claim 1 wherein said means further operates to illuminate said substance said first electromagnetic emission and said second electromagnetic emission simultaneously.

4. The device of claim 1 wherein said information about said first electromagnetic emission irradiated to said substance further includes an amount of said first electromagnetic emission impinging on said substance.

5. The device of claim 1 wherein a lowest wavelength of said first electromagnetic emission and a highest wavelength of said second electromagnetic emission are determined by photosensitivity of said substance.

6. The device of claim 1 wherein said first electromagnetic emission has a lower limit of wavelengths lying in ultraviolet region, and said second electromagnetic emission has an upper limit of wavelengths lying in infrared region.

7. The device of claim 1 wherein said device satisfies relations given by $$E_1 > E_g > E_2$$

where $E_1$ is a photon energy of said first electromagnetic emission, $E_2$ is a photon energy of said second electromagnetic emission, and $E_g$ is an energy bandgap of said substance.

8. The device of claim 1 wherein said substance has a junction between different conductivity types or a Schottky junction.

9. The device of claim 1 wherein said means further operates to irradiate said substance with said first electromagnetic emission to write said information about said first electromagnetic emission into said substance.

10. The device of claim 9 wherein said means further operates to accumulate and store said information about said first electromagnetic emission written into said substance.

11. The device of claim 9 wherein said means further operates to irradiate said substance with said second electromagnetic emission to take out desired pieces of said information about said first electromagnetic emission from said substance.

12. A method for processing information in an electronic device comprising:

irradiating a first electromagnetic emission having a wavelength and an amount to a substance having photoconductivity, an energy bandgap and a trap level to input information into said substance; and irradiating a second electromagnetic emission to said substance to read out said information about at least the wavelength and the amount of said first electromagnetic emission, wherein said first electromagnetic emission has a photon energy greater than an energy bandgap of said substance, and said second electromagnetic emission has a photon energy smaller than said energy bandgap.

13. A method for processing information in an electronic device comprising:

irradiating a first electromagnetic emission having a spectrum to a substance having photoconductivity, an energy bandgap and a trap level to input information into said substance; and irradiating a second electromagnetic emission to said substance to read out said information about at least said spectrum of said first electromagnetic emission, wherein said first electromagnetic emission has a photon energy greater than an energy bandgap of said substance, and said second electromagnetic emission has a photon energy smaller than said energy bandgap.

14. An electronic device comprising:

a substance comprising a CVD diamond and having photoconductivity, an energy bandgap and a trap level; and means for reading out information about a first electromagnetic emission irradiated to said substance in accordance with electric resistance of said substance or photocurrent flowing in said substance with a second electromagnetic emission being irradiated to said substance, wherein said first electromagnetic emission has a photon energy greater than an energy bandgap of said substance, and said second electromagnetic emission has a photon energy smaller than said energy bandgap, and wherein said information about said first electromagnetic emission irradiated to said substance is combinations of wavelengths and amounts of said first electromagnetic emission.

15. An electronic device comprising:

a substance comprising a CVD diamond and having photoconductivity, an energy bandgap and a trap level; and means for reading out information about a first electromagnetic emission irradiated to said substance in accordance with electric resistance of said substance or photocurrent flowing in said substance with a second electromagnetic emission being irradiated to said substance, wherein said first electromagnetic emission has a photon energy greater than an energy bandgap of said substance, and said second electromagnetic emission has a photon energy smaller than said energy bandgap, and wherein a spectrum of said first electromagnetic emission is used as said information about said first electromagnetic emission.

16. An electronic device comprising:

a substance comprising a CVD diamond and having photoconductivity, an energy bandgap and a trap level; and means for reading out information about a first electromagnetic emission irradiated to said substance in accordance with electric resistance of said substance or photocurrent flowing in said substance with a second electromagnetic emission being irradiated to said substance, wherein said first electromagnetic emission has a photon energy greater than an energy bandgap of said substance, and said second electromagnetic emission has a photon energy smaller than said energy bandgap, and wherein said substance has a junction between different conductivity types or a Schottky junction.

* * * * *